(12) United States Patent
Kondo

(10) Patent No.: US 10,477,635 B1
(45) Date of Patent: Nov. 12, 2019

(54) LIGHT EMITTING DEVICE, OPTICAL MEASUREMENT APPARATUS, AND IMAGE FORMING APPARATUS

(71) Applicant: FUJI XEROX CO., LTD., Tokyo (JP)

(72) Inventor: Takashi Kondo, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 16/371,139

(22) Filed: Apr. 1, 2019

(30) Foreign Application Priority Data

Jun. 4, 2018 (JP) .................................. 2018-107178

(51) Int. Cl.
  B41J 2/45 (2006.01)
  G03G 15/04 (2006.01)
  H01L 27/15 (2006.01)
  H05B 33/08 (2006.01)

(52) U.S. Cl.
  CPC ....... *H05B 33/0824* (2013.01); *H01L 27/156* (2013.01); *H05B 33/0815* (2013.01)

(58) Field of Classification Search
  CPC ........ B41J 2/45; B41J 2/455; B41J 2002/453; G03G 15/04054; G03G 15/043; G03G 15/326; H01L 27/15; H01L 27/153; H01L 27/156; H01L 29/74; H01L 29/861; H05B 37/02; H05B 37/029; H05B 33/0803
  See application file for complete search history.

(56) References Cited

U.S. PATENT DOCUMENTS

| 5,177,405 | A  | * | 1/1993  | Kusuda  | ................... | G09G 3/32 257/136 |
| 6,180,960 | B1 | * | 1/2001  | Kusuda  | ...................... | B41J 2/45 257/745 |
| 8,305,415 | B2 | * | 11/2012 | Ohno    | ........................ | B41J 2/45 347/224 |
| 2009/0140658 | A1 | * | 6/2009  | Jo      | ...................... | H05B 33/0851 315/155 |
| 2017/0277065 | A1 |   | 9/2017  | Kondo   | | |

FOREIGN PATENT DOCUMENTS

| JP | H01-238962   | 9/1989  |
| JP | 2001-353902  | 12/2001 |
| JP | 2017-174906  | 9/2017  |

\* cited by examiner

*Primary Examiner* — Haissa Philogene
(74) *Attorney, Agent, or Firm* — JCIPRNET

(57) ABSTRACT

A light emitting device includes plural transfer elements to be sequentially turned on, plural setting elements that are respectively connected to the plural transfer elements and are capable of shifting to an on-state by the transfer element being turned on, plural driving elements that are respectively connected to the plural setting elements and are capable of shifting to the on-state by the setting element being turned on; and plural light emitting elements that are respectively connected to the plural driving elements and have increased light-emission or an increased light-emission intensity by the driving element being turned on, in which plural pairs of the driving element and the light emitting element are connected to at least one of the plural setting elements and the plural light emitting elements are arranged in a two-dimensional shape.

11 Claims, 16 Drawing Sheets

FIG. 9

| LD44 ○ | LD34 × | LD24 × | LD14 ○ |
| --- | --- | --- | --- |
| LD43 ○ | LD33 × | LD23 ○ | LD13 × |
| LD42 × | LD32 ○ | LD22 × | LD12 ○ |
| LD41 ○ | LD31 ○ | LD21 ○ | LD11 ○ |

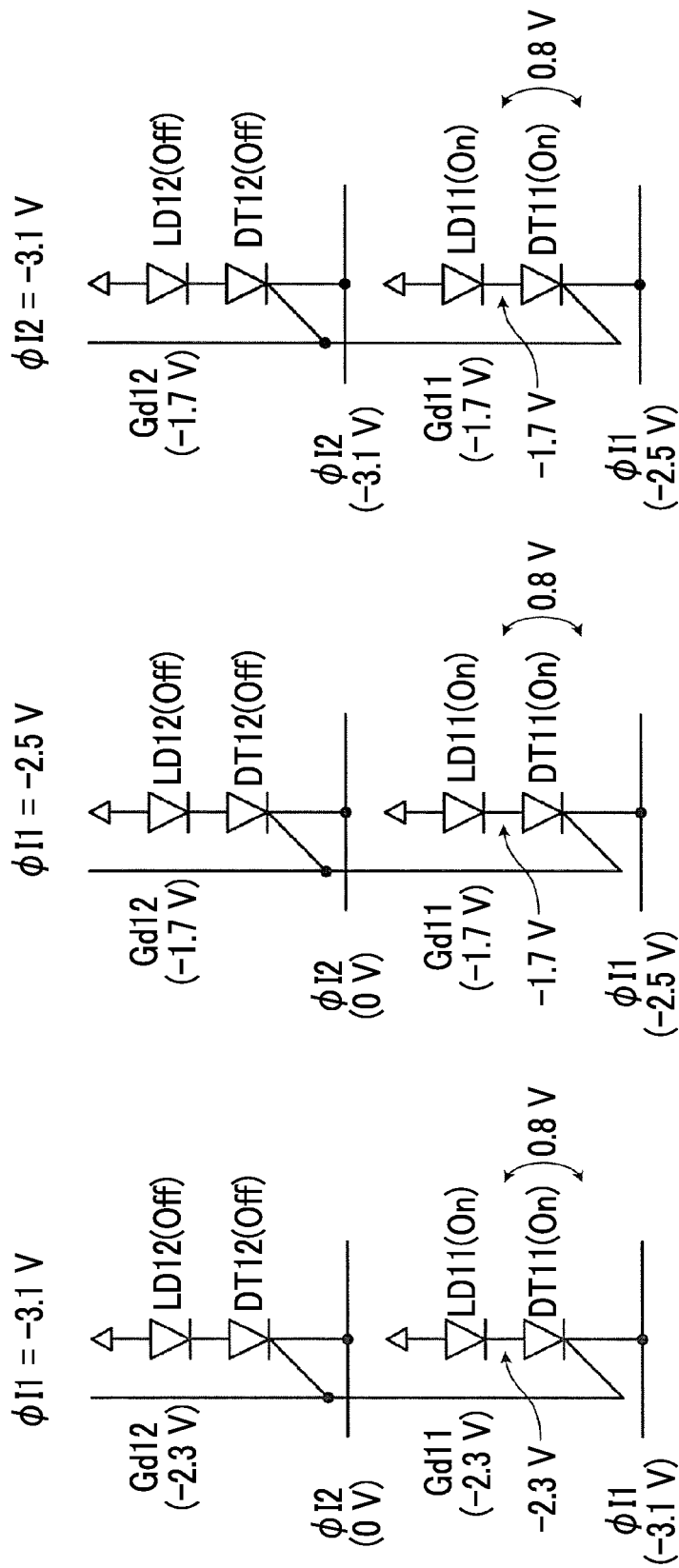

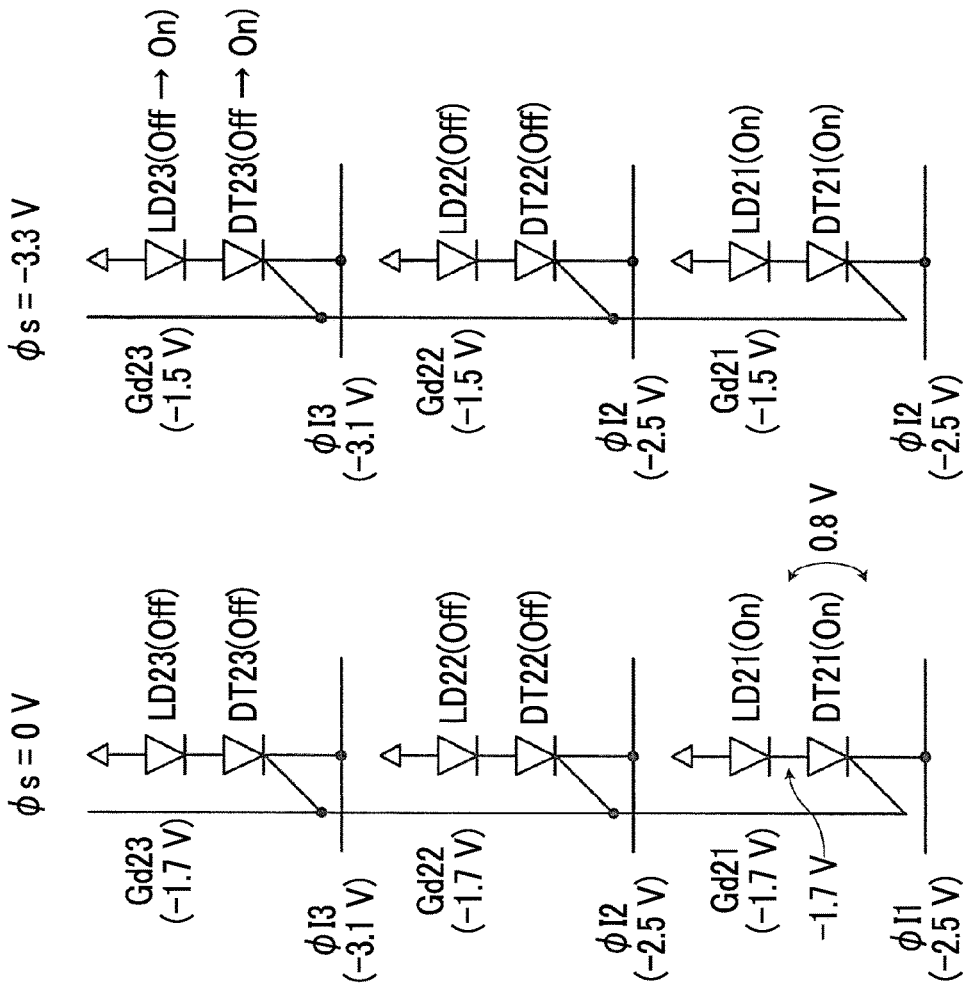
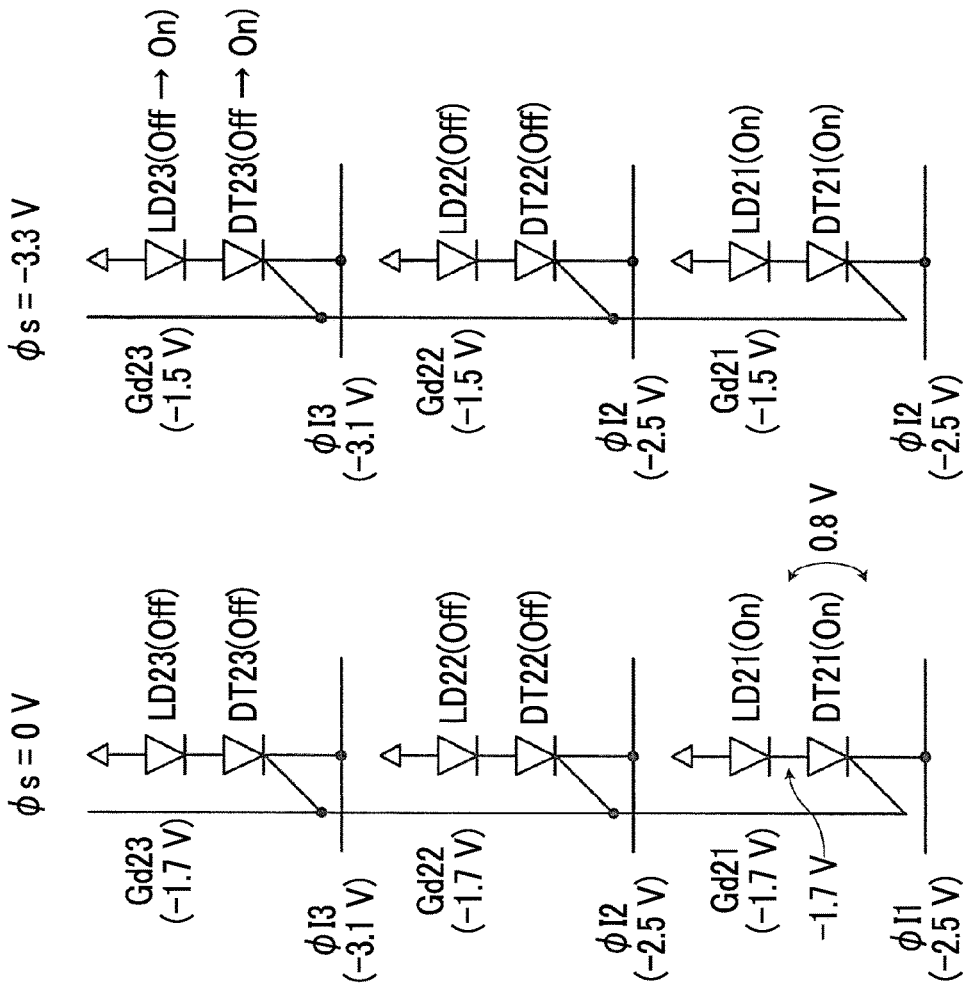
FIG. 13A
FIG. 13B

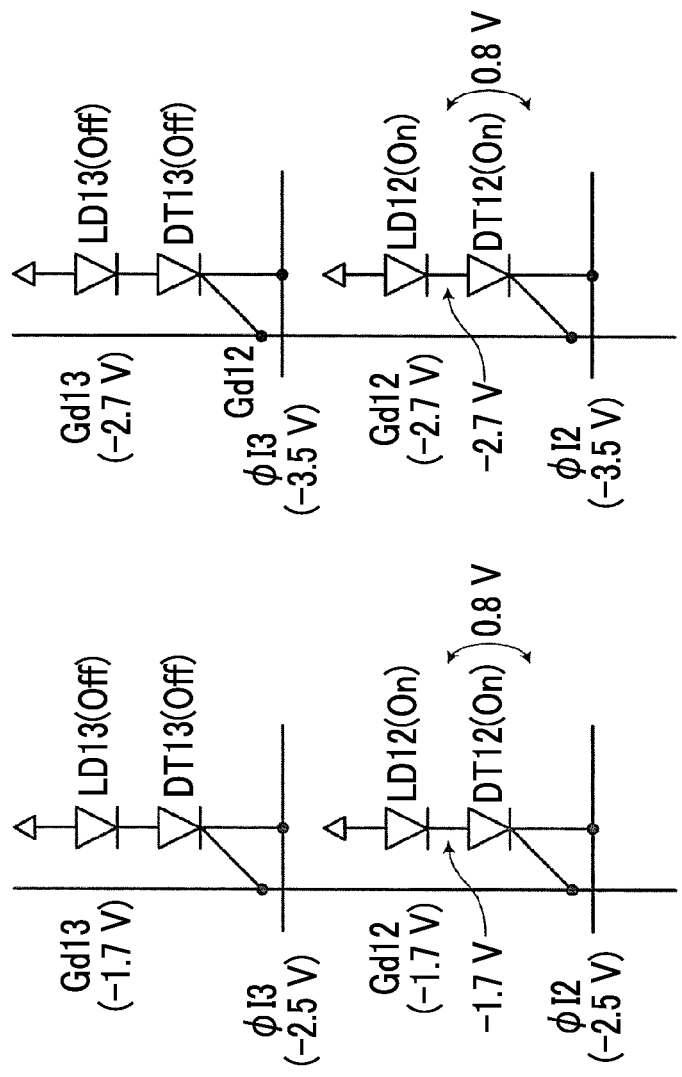

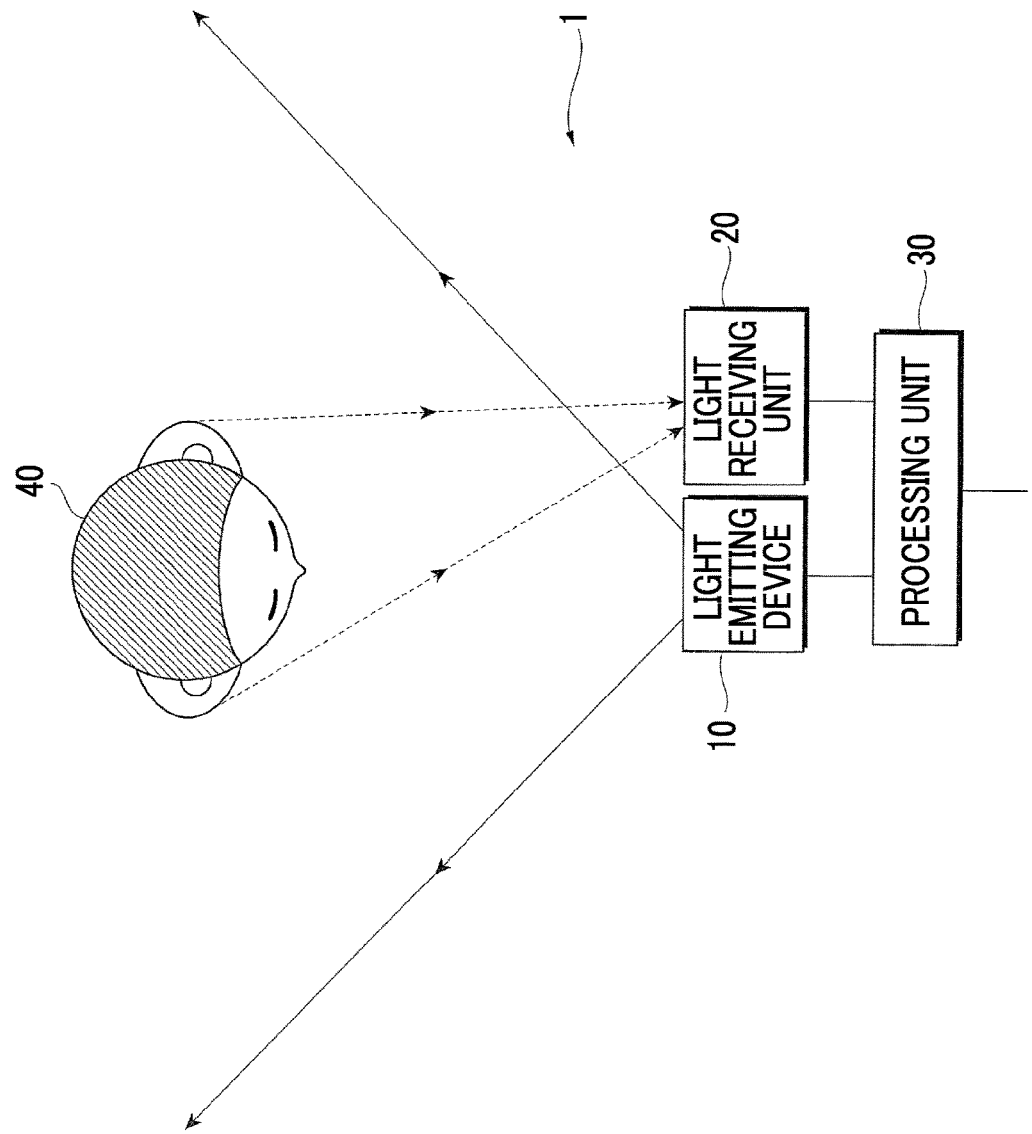

LIGHT EMITTING DEVICE, OPTICAL MEASUREMENT APPARATUS, AND IMAGE FORMING APPARATUS

CROSS-REFERENCE TO RELATED APPLICATIONS

This application is based on and claims priority under 35 USC 119 from Japanese Patent Application No. 2018-107178 filed Jun. 4, 2018.

BACKGROUND

(i) Technical Field

The present invention relates to a light emitting device, an optical measurement apparatus, and an image forming apparatus.

(ii) Related Art

JP1989-238962A discloses alight emitting element array in which a plurality of light emitting elements having a threshold voltage or a threshold current which can be controlled by light from an outside are one-dimensionally, two-dimensionally, or three-dimensionally arranged, at least a part of light generated from each of the light emitting elements is incident on another light emitting element in a vicinity of each of the light emitting elements, and a clock line for applying a voltage or a current from an outside is connected to each of the light emitting elements.

JP2017-174906A discloses a light emitting chip C including a plurality of transfer thyristors T to be sequentially turned on, a plurality of setting thyristors S which are respectively connected to the plurality of transfer thyristors T and can shift to an on-state by the transfer thyristor T being turned on, and a plurality of light emitting diodes LEDs which are laminated on the plurality of setting thyristors S via tunnel junctions and of which light emission or the quantity of light emission increases in a case where the setting thyristor S is turned on.

JP2001-353902A discloses a two-dimensional self-scanning light emitting element array in which two of light emitting signal lines φIj and φI(j+1) of a light emitting unit are connected on a side of a light emitting start point so as to be one line φIj·(j+1), light emitting elements are two-dimensionally arranged in n rows×l columns (l is an integer of 1 or more), an anode electrode of the light emitting element L (j, k) is connected to the light emitting signal line φIj of the n-th row, a gate electrode of the light emitting element (j, 2k−1) in an odd row is connected to a gate signal G2i−1 line in the (2i−1)-th column, and a gate electrode of the light emitting element (j, 2k) in an even row is connected to a gate signal G2i line of the 2i-th column.

SUMMARY

Meanwhile, in a light emitting device in which a light emitting element connected to a transfer element is set to be in a lighting state or a non-lighting state and light is emitted by sequentially transferring (propagating) the on-state in a plurality of transfer elements, it is desired to two-dimensionally light the light emitting element in parallel.

Aspects of non-limiting embodiments of the present disclosure relate to a light emitting device, an optical measurement apparatus, and an image forming apparatus capable of lighting light emitting elements in parallel in a two-dimensional shape.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a light emitting device including: a plurality of transfer elements to be sequentially turned on; a plurality of setting elements that are respectively connected to the plurality of transfer elements and are capable of shifting to an on-state by the transfer element being turned on; a plurality of driving elements that are respectively connected to the plurality of setting elements and are capable of shifting to the on-state by the setting element being turned on; and a plurality of light emitting elements that are respectively connected to the plurality of driving elements and have increased light-emission or an increased light-emission intensity by the driving element being turned on, in which a plurality of pairs of the driving element and the light emitting element are connected to at least one of the plurality of setting elements and the plurality of light emitting elements are arranged in a two-dimensional shape.

BRIEF DESCRIPTION OF THE DRAWINGS

Exemplary embodiment(s) of the present invention will be described in detail based on the following figures, wherein:

FIG. 3A is a cross-sectional view taken along a line IIIA-IIIA in FIG. 2 and FIG. 3B is a cross-sectional view taken along a line IIIB-IIIB in FIG. 2;

FIG. 6A illustrates a case without a voltage reduction layer, FIG. 6B illustrates a case of providing the voltage reduction layer, and FIG. 6C illustrates a thyristor characteristic;

FIG. 8A is a schematic diagram illustrating an energy band in the lamination structure of the laser diode and the driving thyristor, FIG. 8B is a diagram illustrating an energy band of a tunnel junction layer in a reverse bias state, and FIG. 8C illustrates a current voltage characteristic of the tunnel junction layer;

FIG. 9 is a diagram illustrating an example of controlling lighting/non-lighting of the laser diode in the light emitting device;

FIG. 11A illustrates a state in which a setting signal is "H (0 V)", FIG. 11B illustrates a state in which the setting signal shifts to "L (−3.3 V)", and FIG. 11C illustrates a state in which the setting signal returns to "H (0 V)";

FIGS. 12A to 12C are diagrams for explaining an operation of two pairs of the driving thyristor and the laser diode in the light emitting device at approximately a time f in FIG. 10; and FIG. 12A illustrates a state in which a lighting signal is "L1 (−3.1 V)", FIG. 12B illustrates a state in which the lighting signal shifts to "L2 (−2.5 V)", and FIG. 12C illustrates a state in which the lighting signal shifts to "L1 (−3.1 V)";

FIGS. 13A and 13B are diagrams for explaining an operation of three pairs of the driving thyristor and the laser diode in the light emitting device at approximately a time m in FIG. 10; and FIG. 13A illustrates a state in which a setting signal φs is "H (0 V)" and FIG. 13B illustrates a state in which the setting signal φs shifts to "L (−3.3 V)";

FIGS. 14A and 14B are diagrams for explaining an operation of two pairs of the driving thyristor and the laser diode in the light emitting device at approximately a time u at which a lighting maintenance period is started in FIG. 10; and FIG. 14A illustrates a state in which lighting signals φI2 and φI3 are "L2 (−2.5 V)" and FIG. 14B illustrates a state in which the lighting signals φI2 and φI3 shift to "L3 (−3.5 V)";

FIG. 15 is a diagram for explaining an optical measurement apparatus using the light emitting device.

DETAILED DESCRIPTION

Hereinafter, an exemplary embodiment of the present invention will be described in detail with reference to drawings.

Light Emitting Device 10

Figure 1:
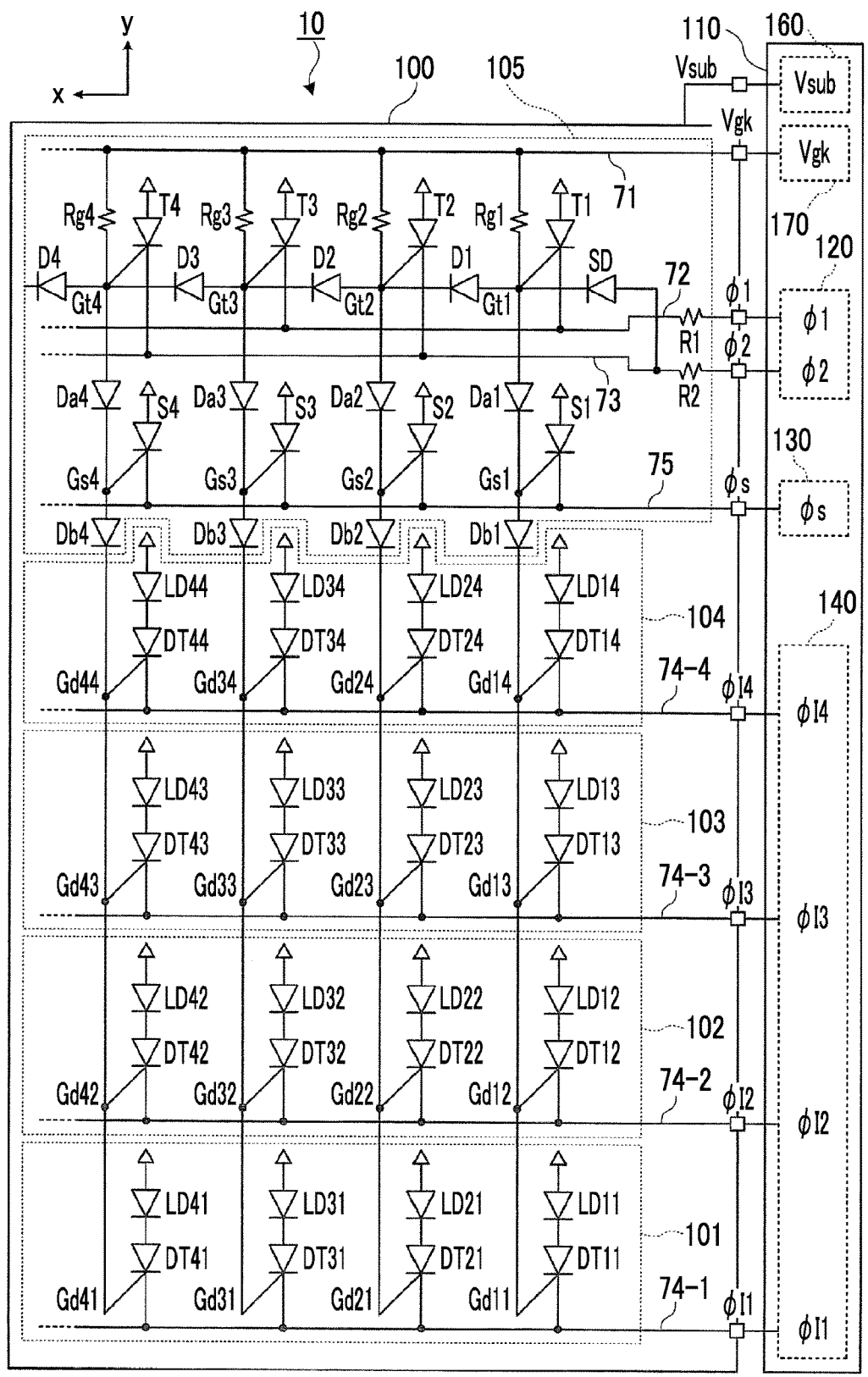
FIG. 1 is an equivalent circuit diagram of a light emitting device.

FIG. 1 is an equivalent circuit diagram of a light emitting device 10.

The light emitting device 10 includes a light emitting unit 100 and a control unit 110.

The light emitting unit 100 includes a laser diode LD which emits a laser beam, as an example of a light emitting element. The light emitting unit 100 is configured as a self-scanning light emitting device (SLED) array as described below. The laser diode LD is, for example, a vertical cavity surface emitting laser (VCSEL).

In FIG. 1, the light emitting unit 100 includes 16 laser diodes LD arranged in a matrix of 4×4 (two-dimensional shape). The two-dimensional shape means that the number of dimensions is two, for example, the dimensions extend in an x-direction and in a y-direction to be described below. Here, in FIG. 1, a direction from the right to the left is defined as the x-direction and a direction from the bottom to the upper is defined as the y-direction. The x-direction and the y-direction are orthogonal. A light emitting element unit 101 in which laser diodes LD11, LD21, LD31, and LD41 are arranged in the x-direction, a light emitting element unit 102 in which laser diodes LD12, LD22, LD32, and LD42 are arranged in the x-direction, a light emitting element unit 103 in which laser diodes LD13, LD23, LD33, and LD43 are arranged in the x-direction, and a light emitting element unit 104 in which laser diodes LD14, LD24, LD34, and LD44 are arranged in the x-direction are provided.

In addition, the laser diodes LD of ones respectively included in the light emitting element units 101 to 104 are arranged in the y-direction. That is, the laser diodes LD11, LD12, LD13, and LD14 are arranged in the y-direction, the laser diodes LD21, LD22, LD23, and LD24 are arranged in the y-direction, the laser diodes LD31, LD32, LD33, and LD34 are arranged in the y-direction, the laser diodes LD41, LD42, LD43, and LD44 are arranged in the y-direction.

As described above, in a case of distinguishing the laser diodes LD from one another, a two-digit number such as "LD11" is attached. In some cases, "i" is substituted for a number in the x-direction, "j" is substituted for a number in the y-direction, and "LDij" is denoted. In the same manner, also in other cases, in a case where a number is attached only in the x-direction, "i" is attached instead of attaching an individual number, and in a case where a number is attached only in the y-direction, "j" is attached instead of attaching an individual number. Here, i and j are integers of 1 to 4.

There are provided 16 driving thyristors DT. Each of the driving thyristors DT is connected to each of the laser diodes LD. Here, each of the driving thyristors DT is connected in series with each of the laser diodes LD. That is, a pair is configured to include the driving thyristor DT and the laser diode LD. Therefore, the same numbers as those of the connected laser diodes LD are attached to the driving thyristors DT so as to distinguish the driving thyristors DT from one another.

In the present specification, "to" indicates a plurality of components distinguished from one another by numbers, and it means that "to" includes numbers described before and after "to" and those with numbers between the numbers. For example, the light emitting element units 101 to 104 include the light emitting element unit 101, the light emitting element unit 102, the light emitting element unit 103, and the light emitting element unit 104 in order of numbers.

The light emitting unit 100 includes a transfer element unit 105 having four transfer thyristors T, four setting thyristors S, four coupling diodes D, four connection diodes Da and four connection diodes Db, and four resistors Rg. Further, the transfer element unit 105 includes a start diode SD and current limiting resistors R1 and R2.

The transfer thyristors T are arranged in the x-direction in order of transfer thyristors T1, T2, T3, and T4. Regarding the coupling diodes D, coupling diodes D1, D2, D3, and D4 are arranged in the x-direction. The coupling diodes D1, D2, and D3 are respectively provided between the transfer thyristors T1, T2, T3, and T4 and the coupling diode D4 is provided on a side opposite to a side on which the coupling diode D3 is provided based on the transfer thyristor T4.

The setting thyristors S are arranged in the x-direction in order of setting thyristors S1, S2, S3, and S4.

In the same manner, the connection diodes Da and Db, and the resistor Rg are arranged in the x-direction.

Since the transfer thyristor T, the setting thyristor S, the coupling diode D, the connection diodes Da and Db, and the resistor Rg are arranged in the x-direction, one digit number is attached. In some cases, instead of attaching an individual number, "i" may be attached.

Each of the laser diode LD, the coupling diode D, and the connection diodes Da and Db is a two-terminal element including an anode and a cathode. Each of the driving thyristor DT, the transfer thyristor T, and the setting thyristor S is a three-terminal element including an anode, a cathode, and a gate. Gates of the driving thyristor DTij (i, j=1 to 4) are distinguished as a gate Gdij, gates of the transfer thyristor T1 (i=1 to 4) are distinguished as a gate Gti, and gates of the setting thyristor S1 (i=1 to 4) are distinguished as a gate Gsi.

Here, the driving thyristor DT is an example of a driving element, the transfer thyristor T is an example of a transfer element, and the setting thyristor S is an example of a setting element.

Next, a connection relationship between the elements (the laser diode LD, the driving thyristor DT, the transfer thyristor T, and the like) described above will be described.

As described above, the laser diodes LDij (i, j=1 to 4) and the driving thyristors DTij are connected in series. That is, an anode of the laser diode LDij is connected to a reference potential Vsub (such as a ground potential (GND)) and a cathode of the laser diode LDij is connected to an anode of the driving thyristor DTij.

Figure 3:
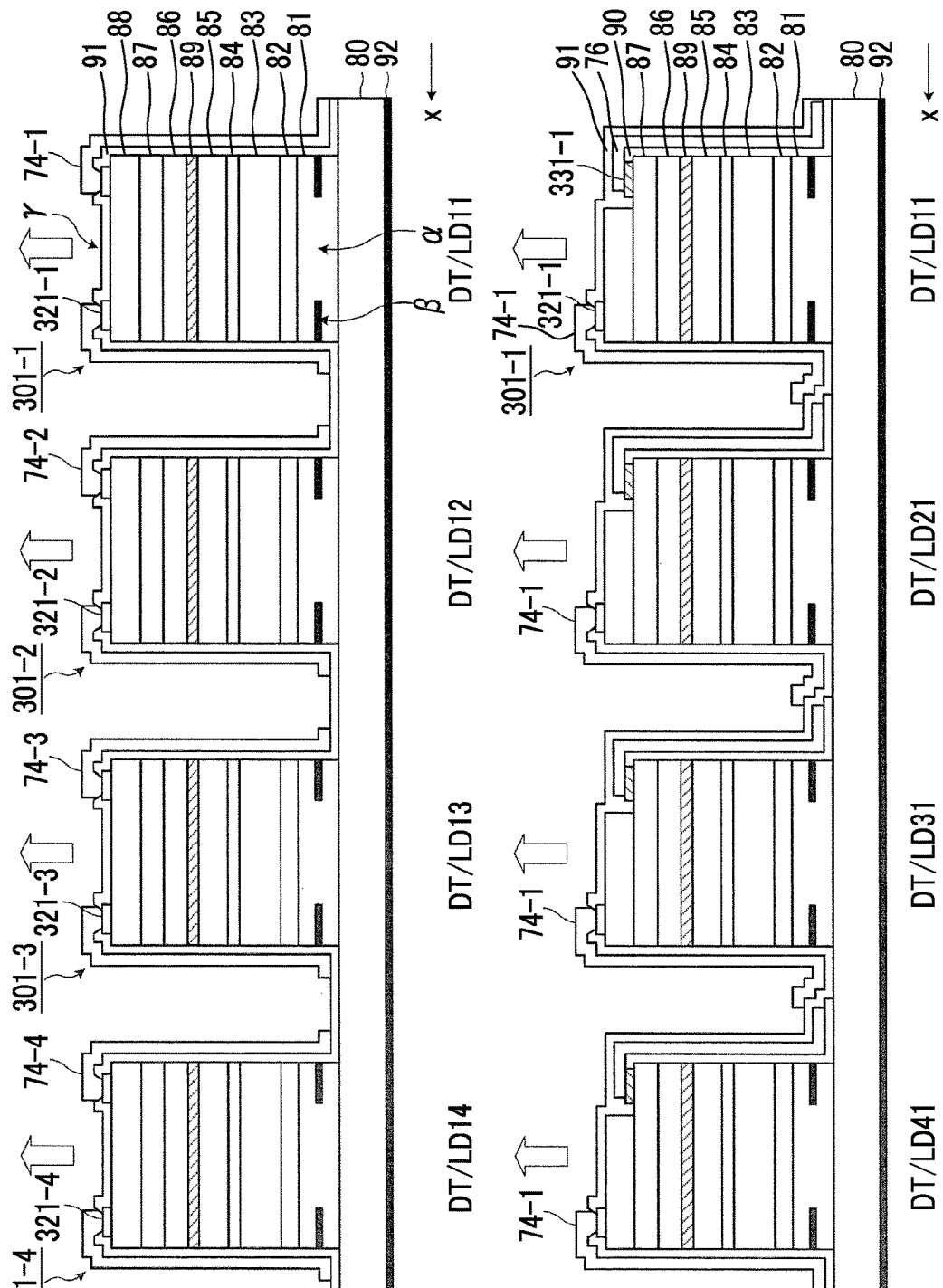
FIGS. 3A and 3B are cross-sectional views of a driving thyristor and a laser diode.

As described below, the reference potential Vsub is supplied via a rear surface electrode 92 (see FIGS. 3A and 3B to be described below) provided on a rear surface of a substrate 80 constituting the light emitting unit 100.

A cathode of a driving thyristor DTi1 included in the light emitting element unit 101 is connected to a lighting signal line 74-1. The lighting signal line 74-1 is connected to a φI1 terminal and a lighting signal φI1 is supplied from the control unit 110.

A cathode of a driving thyristor DTi2 included in the light emitting element unit 102 is connected to a lighting signal line 74-2. The lighting signal line 74-2 is connected to a φI2 terminal and a lighting signal φI2 is supplied from the control unit 110.

In addition, a cathode of a driving thyristor DTi3 included in the light emitting element unit 103 is connected to a lighting signal line 74-3. The lighting signal line 74-3 is connected to a φI3 terminal and a lighting signal φI3 is supplied from the control unit 110.

In the same manner, a cathode of a driving thyristor DTi4 included in the light emitting element unit 104 is connected to a lighting signal line 74-4. The lighting signal line 74-4 is connected to a φI4 terminal and a lighting signal φI4 is supplied from the control unit 110.

That is, a cathode of the driving thyristor DTij is connected to a lighting signal line 74-j and the lighting signal line 74-j is connected to a φIj terminal. Thus, a lighting signal φIj is supplied from the control unit 110 to the φIj terminal.

In the transfer element unit 105, an anode of the transfer thyristor T1 is connected to the reference potential Vsub. Cathodes of the odd-numbered transfer thyristors T1 and T3 are connected to a transfer signal line 72. The transfer signal line 72 is connected to a φI terminal via the current limiting resistor R1 and a transfer signal φ1 is supplied from the control unit 110. Cathodes of the even-numbered transfer thyristors T2 and T4 are connected to a transfer signal line 73. The transfer signal line 73 is connected to a φ2 terminal via the current limiting resistor R2 and a transfer signal φ2 is supplied from the control unit 110.

Coupling diodes Di are connected in series. That is, a cathode of one coupling diode D is connected to an anode of the coupling diode D adjacent in the x-direction. An anode of the start diode SD is connected to the transfer signal line 73 and a cathode of the start diode SD is connected to an anode of the coupling diode D1.

The cathode of the start diode SD and the anode of the coupling diode D1 are connected to a gate Gt1 of the transfer thyristor T1. A cathode of the coupling diode D1 and an anode of the coupling diode D2 are connected to a gate Gt2 of the transfer thyristor T2. A cathode of the coupling diode D2 and an anode of the coupling diode D3 are connected to a gate Gt3 of the transfer thyristor T3. A connection point of a cathode of the coupling diode D3 and an anode of the coupling diode D4 is connected to a gate Gt4 of the transfer thyristor T4.

In addition, an anode of the setting thyristor S1 (i=1 to 4) is connected to the reference potential Vsub and a cathode of the setting thyristor S1 (i=1 to 4) is connected to a setting signal line 75. The setting signal line 75 is connected to a φs terminal and a setting signal φs is supplied from the control unit 110.

The gate Gti of the transfer thyristor T1 is connected to a power supply line 71 via the resistor Rg. The power supply line 71 is connected to a Vgk terminal and a power supply potential Vgk (for example, −3.3V) is supplied from the control unit 110.

The gate Gti of the transfer thyristor T1 is connected to a gate of the setting thyristor S1 via a connection diode Dai. The gate Gsi of the setting thyristor S1 is connected to the gate Gdij of the driving thyristor DTij via a connection diode Dbi.

That is, a plurality of pairs (here, four pairs) of the driving thyristor DT and the laser diode LD are connected to each of the setting thyristors S.

A configuration of the control unit 110 will be described.

The control unit 110 generates a signal such as the lighting signal φIj or the like and supplies the signal to the light emitting unit 100. The light emitting unit 100 is operated by the supplied signal. The control unit 110 is configured to include an electronic circuit. For example, the control unit 110 is configured as an integrated circuit (IC).

The control unit 110 includes a transfer signal generation unit 120, a setting signal generation unit 130, a lighting signal generation unit 140, a reference potential generation unit 160, and a power supply potential generation unit 170.

The transfer signal generation unit 120 generates the transfer signals φ1 and φ2, and supplies the transfer signal φ1 to the φ1 terminal of the light emitting unit 100 and supplies the transfer signal φ2 to the φ2 terminal of the light emitting unit 100.

The setting signal generation unit 130 generates the setting signal φs and supplies the setting signal φs to the φs terminal of the light emitting unit 100.

The lighting signal generation unit 140 generates the lighting signal φIj and supplies the lighting signal φIj to the φIj terminal of the light emitting unit 100.

The reference potential generation unit 160 generates the reference potential Vsub and supplies the reference potential Vsub to a Vsub terminal of the light emitting unit 100. The power supply potential generation unit 170 generates the power supply potential Vgk and supplies the power supply potential Vgk to the Vgk terminal of the light emitting unit 100.

The signals generated by the transfer signal generation unit 120, the setting signal generation unit 130, the lighting signal generation unit 140, the reference potential generation unit 160, and the power supply potential generation unit 170 will be described below.

In the above description, in the light emitting unit 100, the laser diodes LD are two-dimensionally arranged in 4×4, but the laser diodes LD are not limited to 4×4. For example, i and j in i×j may be a plurality of numerical values other than 4. The number of the transfer thyristors T and the setting thyristors S may be i. The number of the transfer thyristors T and the setting thyristors S may be larger than i or may be smaller than i.

Layout of Light Emitting Unit 100

The light emitting unit 100 is configured to include a semiconductor material which emits a laser beam. For example, the light emitting unit 100 is configured as a GaAs-based compound semiconductor. That is, as illustrated in cross-sectional views to be described below (see FIGS. 3A, 3B, and 5 to be described below), the light emitting unit 100 is configured as a semiconductor layer laminate in which a plurality of GaAs-based compound semiconductor layers are laminated on the substrate 80 configured as p-type GaAs. The substrate 80 is set to the reference potential Vsub by supplying the reference potential Vsub to the rear surface electrode 92 formed on a rear surface of the substrate 80. First, a planar layout will be described.

Figure 2:
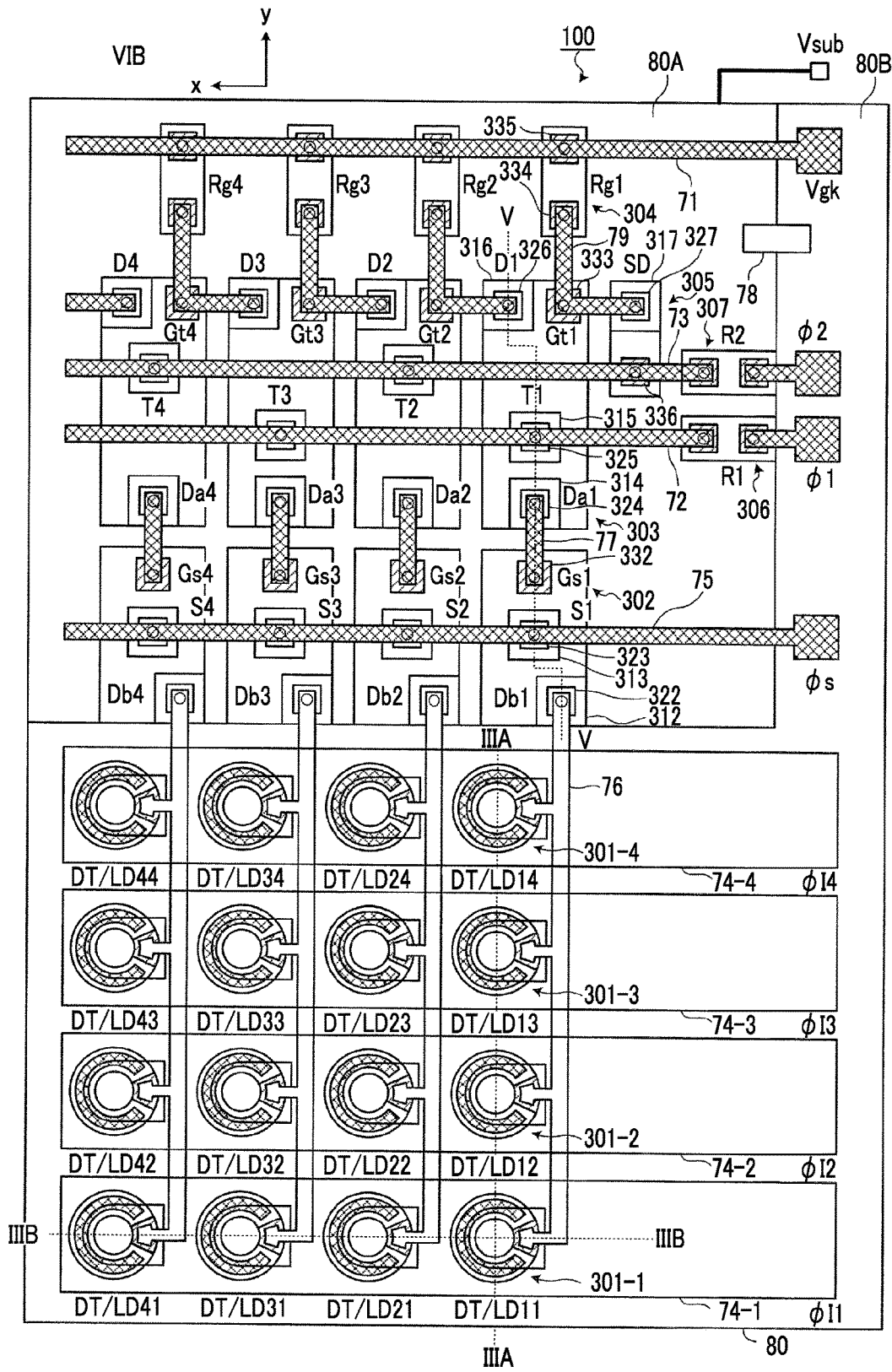
FIG. 2 is a diagram illustrating an example of a planar layout of a light emitting unit.

FIG. 2 is a diagram illustrating an example of a planar layout of the light emitting unit 100.

Here, the planar layout of the light emitting unit 100 will be described by islands 301 to 307 illustrated in FIG. 2. A configuration in which the semiconductor layer laminate is separated by mesa etching is referred to as an island.

The island 301 includes islands 301-$j$ ($j=1$ to 4), a laser diode LD1$j$ and a driving thyristor DT1$j$ are provided in each of the islands 301-$j$. The laser diode LD1$j$ and the driving thyristor DT1$j$ are connected in series by being laminated. In FIG. 2, the laser diode LD1$j$ and the driving thyristor DT1$j$ are denoted as DT/LD1$j$. DT/LDij ($i=2$ to 4 and $j=1$ to 4) is provided so that a plurality of islands in the same shapes as the island 301 (the island 301-$j$) are provided in parallel with the island 301 (the island 301-$j$) in the x-direction.

A connection diode Db1 and the setting thyristor S1 are provided in the island 302. A plurality of islands in the same shapes as the island 302 are provided in parallel with the island 302 in the x-direction, and the connection diode Dbi ($i=2$ to 4) and the setting thyristor S1 ($i=2$ to 4) are provided.

A connection diode Da1, the transfer thyristor T1, and the coupling diode D1 are provided in the island 303. A plurality of islands in the same shapes as the island 303 are provided in parallel with the island 303 in the x-direction, and the connection diode Dai ($i=2$ to 4), the transfer thyristor Ti ($i=2$ to 4), and the coupling diode Di ($i=2$ to 4) are provided.

A resistor Rg1 is provided in the island 304. A plurality of islands in the same shapes as the island 304 are provided in parallel with the island 304 in the x-direction, and a resistor Rgi ($i=2$ to 4) is provided.

The start diode SD is provided in the island 305. The current limiting resistor R1 is provided in the island 306 and the current limiting resistor R2 is provided in the island 307.

Next, a cross-sectional structure of the light emitting unit 100 will be described.

FIGS. 3A and 3B are cross-sectional views of the driving thyristor DT and the laser diode LD. FIG. 3A is a cross-sectional view taken along a line IIIA-IIIA in FIG. 2 and FIG. 3B is a cross-sectional view taken along a line IIIB-IIIB in FIG. 2.

As illustrated in FIG. 3A, a p-type anode layer (hereinafter, referred to as "p-anode layer" and the same manner is applied to the following) 81, a light emitting layer 82, and an n-type cathode layer (an n-cathode layer) 83 constituting the laser diode LD are laminated on the substrate 80 of p-type GaAs. A tunnel junction layer 84 is laminated on the n-cathode layer 83 constituting the laser diode LD. A p-type anode layer (a p-anode layer) 85, a voltage reduction layer 89, an n-type gate layer (an n-gate layer) 86, a p-type gate layer (a p-gate layer) 87, and an n-type cathode layer (an n-cathode layer) 88 constituting the driving thyristor DT are provided on the tunnel junction layer 84. These semiconductor layer laminates are separated by mesa etching.

The p-anode layer 81 of the laser diode LD includes a current constriction layer. The current constriction layer means a layer such as AlAs in which $Al_2O_3$ is formed by oxidation of Al, so that an electric resistance is increased and a current hardly flows. That is, since oxidation proceeds from a portion (a peripheral portion) exposed by mesa etching, a central portion can be prevented from being oxidized. An area (a current passing area α) in which a current easily flows remains in the central portion, and the peripheral portion becomes an area (a current blocking area β) in which a current hardly flows by oxidation. Non-light emitting recoupling is likely to occur in the peripheral portion in which there are many defects due to the mesa etching. By providing the current blocking area β, a power consumed for the non-light emitting recoupling is suppressed, so that low power consumption and improvement in light extraction efficiency can be obtained. The light extraction efficiency is the quantity of light which can be extracted per power.

An n-ohmic electrode 321 (n-ohmic electrodes 321-1, 321-2, 321-3, and 321-4) configured as a metallic material which is likely to form ohmic contact with the n-cathode layer 88 is provided on the n-cathode layer 88. The n-ohmic electrode 321 is provided in a horseshoe shape so as to surround an emitting port y through which a laser beam indicated by an arrow is emitted (see FIG. 4 to be described below). Except for the n-ohmic electrode 321, an insulating layer 91 is provided. A lighting signal line 74 (the lighting signal lines 74-1, 74-2, 74-3, and 74-4) is provided so as to connect the n-ohmic electrode 321, on the insulating layer 91. The lighting signal line 74-1 is connected to the n-ohmic electrode 321-1 of a driving thyristor DT11/a laser diode LD11, the lighting signal line 74-2 is connected to the n-ohmic electrode 321-2 of a driving thyristor DT12/a laser diode LD12, the lighting signal line 74-3 is connected to the n-ohmic electrode 321-3 of a driving thyristor DT13/a laser diode LD13, and the lighting signal line 74-4 is connected to the n-ohmic electrode 321-4 of a driving thyristor DT14/a laser diode LD14.

As illustrated in FIG. 3B, in the cross-sectional view taken along a line IIIB-IIIB, in the driving thyristor DT, a part of the n-cathode layer 88 is removed so as to expose the p-gate layer 87. A p-ohmic electrode 331 (only a p-ohmic electrode 331-1 is illustrated in FIG. 3B) configured as a metallic material which is likely to form an ohmic contact with the p-gate layer 87 is provided on the exposed p-gate layer 87. A wiring 76 connecting the p-ohmic electrode 331-1 and an n-ohmic electrode 322 on an area 312 of the connection diode Db1 provided in the island 302 is provided on an insulating layer 90.

In FIG. 3B, the lighting signal line 74-1 connected to the n-ohmic electrode 321-1 is connected to the same n-ohmic electrode as the n-ohmic electrodes 321-1 of the other driving thyristor DT21 (DT/LD21), driving thyristor DT31 (DT/LD31), and driving thyristor DT41 (DT/LD41).

Figure 4:
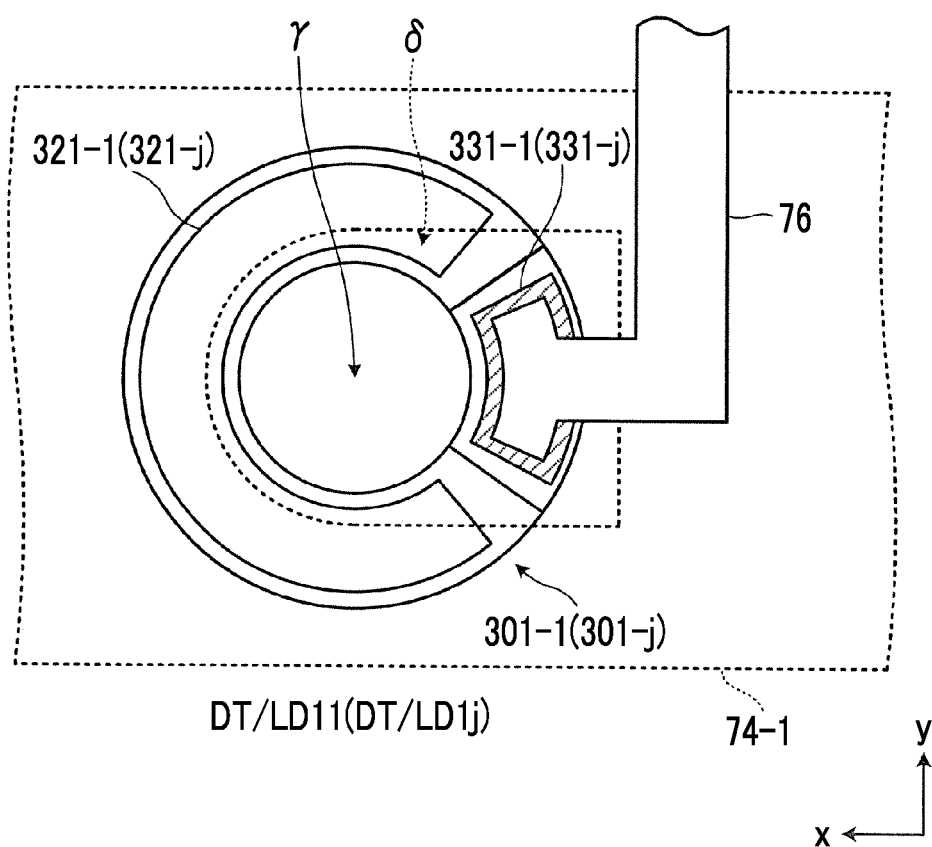
FIG. 4 is an enlarged plan view of the driving thyristor and the laser diode.

FIG. 4 is an enlarged plan view of the driving thyristor DT/the laser diode LD. Here, although the driving thyristor DT11/the laser diode LD11 will be described, the same manner is also applied to the driving thyristor DT12/the laser diode LD12, the driving thyristor DT13/the laser diode LD13, and the driving thyristor DT14/the laser diode LD14 arranged in the y-direction, so that the thyristors and the diodes are illustrated as a symbol of "j". The lighting signal line 74-1 is indicated by a broken line for distinguishing the lighting signal line 74-1 from others.

As illustrated in FIG. 4, the driving thyristor DT11/the laser diode LD11 (the driving thyristor DT1$j$/the laser diode LD1*j*) are provided in an island 301-1 (the island 301-*j*). The island 301-1 (the island 301-*j*) has a circular planar shape, and a central portion is the circular emitting port y through which light is emitted. The planar shape of the island 301-1 (the island 301-*j*) may not be circular, and may be another shape such as a quadrilateral shape, a polygonal shape exceeding a quadrilateral shape, or the like. The same manner is also applied to the emitting port y.

A part of a peripheral portion of the n-cathode layer 88 is removed so as to expose the p-gate layer 87. The p-ohmic electrode 331-1 (331-*j*) is provided on the exposed p-gate layer 87. The p-ohmic electrode 331-1 (the p-ohmic electrode 331-*j*) is connected to the wiring 76.

On the other hand, the n-ohmic electrode 321-1 (an n-ohmic electrode 321-*j*) is provided in a horseshoe shape on the n-cathode layer 88 so as to surround the emitting port y. The n-ohmic electrode 321-1 is connected to the lighting signal line 74-1. In the lighting signal line 74-1, a portion of the emitting port y of light is an opening δ. Accordingly, the light emitted by the laser diode LD1*j* is not blocked by the lighting signal line 74-1.

As illustrated in FIGS. 3A and 3B, light emitted from the laser diode LD1*j* is emitted via the driving thyristor DT1*j*. As another example, a part or all of the driving thyristor DT1*j* at a position through which the light emitted by the laser diode LD1*j* passes may be removed and optical absorption in the driving thyristor DT1*j* may be reduced or eliminated. Alternatively, a direction of the light emitted from the laser diode LD1*j* may be a side (rear surface emission) of the substrate 80.

In the above description, although the driving thyristor DT1*j*/the laser diode LD1*j* arranged in the y-direction are described, the same manner is also applied to the driving thyristor DT/the laser diode LD arranged in the x-direction.

Figure 5:
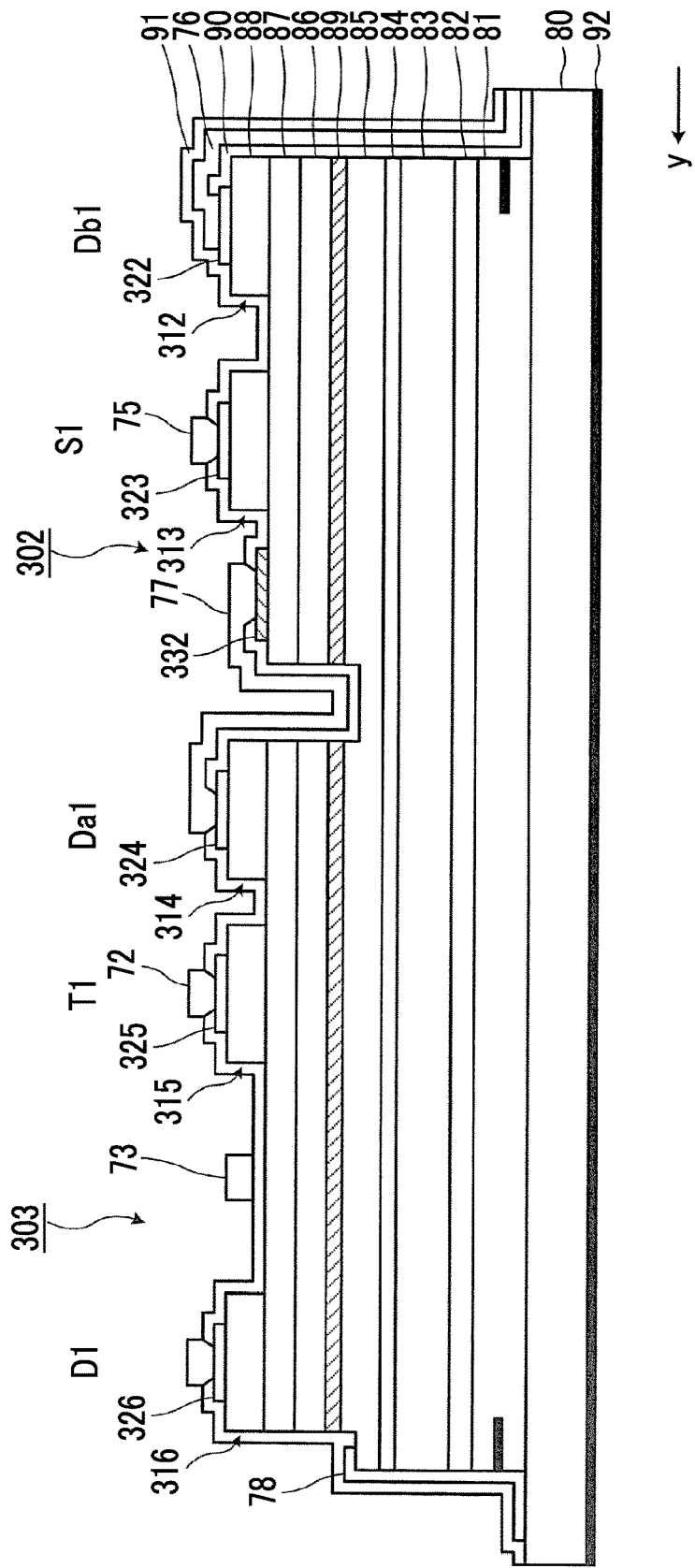
FIG. 5 is a cross-sectional view of an island including a setting thyristor and a connection diode, and an island including a transfer thyristor, a coupling diode, and a connection diode.

FIG. 5 is a cross-sectional view of the island 302 including the setting thyristor S1 and the connection diode Db1, and the island 303 including the transfer thyristor T1, the coupling diode D1, and the connection diode Da1. FIG. 5 is a cross-sectional view taken along a line V-V in FIG. 2. The coupling diode D1, the transfer thyristor T1, the connection diode Da1, the setting thyristor S1, and the connection diode Db1 are illustrated from the left side (the positive side in the x-direction) in FIG. 5.

The p-anode layer 81, the light emitting layer 82, the n-cathode layer 83, the tunnel junction layer 84, the p-anode layer 85, the voltage reduction layer 89, the n-gate layer 86, the p-gate layer 87, the n-cathode layer 88 are laminated on the substrate 80 of p-type GaAs. That is, also in the islands 302 and 303, a structure of the semiconductor layer laminate is the same as the driving thyristor DT/the laser diode LD illustrated in FIGS. 3A and 3B.

Meanwhile, as illustrated in FIG. 5, an outer side of the islands 302 and 303 is mesa-etched until reaching the substrate 80. On the other hand, mesa etching is performed until reaching the p-anode layer 85 between the islands 302 and 303. The p-anode layer 85 is connected to the substrate 80 (the reference potential Vsub) by a wiring 78. That is, in the islands 302 and 303, the p-anode layer 81, the light emitting layer 82, and the n-cathode layer 83 which function as the laser diode LD in the island 301 are short-circuited by the wiring 78 so as not to function as the laser diodes LD. Here, the wiring 78 is provided so as to be in contact with exposed side surfaces of the p-anode layer 81, the light emitting layer 82, and the n-cathode layer 83. As described above, since the p-anode layer 81, the light emitting layer 82, and the n-cathode layer 83 do not function as the laser diodes LD, the wiring 78 may be provided so as to short-circuit each of the layers exposed on the side surfaces. Since the wiring 78 connects the p-type substrate 80 and the p-anode layer 85, the wiring 78 may be formed at the same time with the p-ohmic electrode 331 or the like.

Although not illustrated in FIG. 5, the islands 304, 305, 306, and 307 are also in a state in which the islands 302 and 303 and the p-anode layer 85 are connected.

That is, as illustrated in FIG. 2, the substrate 80 includes an area 80B in which a semiconductor layer laminate is mesa-etched to the substrate 80 and an area 80A in which a semiconductor layer laminate is mesa-etched until the p-anode layer 85 is exposed. The area 80A includes the islands 302, 303, 304, 305, 306, and 307 and the same islands as the islands 302, 303, 304, 305, 306, and 307. On the other hand, the area 80B includes the island 301-*j* and the same island as the island 301-*j*. However, in the area 80A, the current blocking area β may be formed on the p-anode layer 81 and a part of the p-anode layer 81 may remain. In addition, in the area 80B, the p-anode layer 85 may remain and a part of the p-anode layer 85 in a thickness direction may be etched.

Next, details of the islands 302 and 303 will be described.

In the island 302, the areas 312 and 313 of the n-cathode layer 88 remain and the p-gate layer 87 is exposed. It is assumed that the connection diode Db1 has the area 312 of the n-cathode layer 88 as a cathode layer and the n-ohmic electrode 322 provided on the area 312 as a cathode. The connection diode Db1 has the p-gate layer 87 as an anode layer and is connected to the p-gate layer 87 of the adjacent setting thyristor S1. Alternatively, it is assumed that the connection diode Db1 has a p-ohmic electrode 332 provided on the p-gate layer 87 as an anode.

It is assumed that the setting thyristor S1 has the area 313 of the n-cathode layer 88 as a cathode layer, the p-gate layer 87 as a p-gate layer, the n-gate layer 86 as an n-gate layer, and the p-anode layer 85 provided to be interposed with the voltage reduction layer 89 as an anode layer. The p-anode layer 85 is connected to the substrate 80 (the reference potential Vsub). It is assumed that the p-ohmic electrode 332 provided on the p-gate layer 87 becomes a gate.

In the island 303, areas 314, 315, and 316 of the n-cathode layer 88 remain and the p-gate layer 87 is exposed. It is assumed that the connection diode Da1 has the area 314 of the n-cathode layer 88 as a cathode layer and an n-ohmic electrode 324 provided on the area 314 as a cathode. It is assumed that the connection diode Da1 has the p-gate layer 87 as an anode layer and a p-ohmic electrode 333 (see FIG. 2) provided on the p-gate layer 87 as an anode. In the same manner, it is assumed that the coupling diode D1 has the area 316 of the n-cathode layer 88 as a cathode layer and an n-ohmic electrode 326 provided on the area 316 as a cathode. The coupling diode D1 has the p-gate layer 87 as an anode layer and is connected to the p-gate layer 87 of the adjacent transfer thyristor T1. Alternatively, it is assumed that the coupling diode D1 has the p-ohmic electrode 333 (see FIG. 2) provided on the p-gate layer 87 as an anode.

It is assumed that the transfer thyristor T1 has the area 315 of the n-cathode layer 88 as a cathode layer, the p-gate layer 87 as a p-gate layer, the n-gate layer 86 as an n-gate layer, and the p-anode layer 85 provided to be interposed with the voltage reduction layer 89 as an anode layer. The p-anode layer 85 is connected to the substrate 80 (the reference potential Vsub). It is assumed that the p-ohmic electrode 333 (see FIG. 2) provided on the p-gate layer 87 becomes a gate.

Returning to FIG. 2, the islands 304, 305, 306, and 307 will be described.

In the island 304, the n-cathode layer 88 is removed and the p-gate layer 87 is exposed. The resistor Rg1 uses the p-gate layer 87 between p-ohmic electrodes 334 and 335 provided on the exposed p-gate layer 87 as a resistor (see FIG. 2).

In the island 305, an area 317 of the n-cathode layer 88 remains and the p-gate layer 87 is exposed. It is assumed that the start diode SD has the area 317 of the n-cathode layer 88 as a cathode layer and an n-ohmic electrode 327 provided on the area 317 as a cathode. A p-ohmic electrode 336 provided on the p-gate layer 87 is assumed to be an anode.

In the islands 306 and 307, in the same manner as the island 304, the n-cathode layer 88 is removed and the p-gate layer 87 is exposed. In the same manner as the resistor Rg1, the current limiting resistors R1 and R2 use the p-gate layer 87 between a pair of p-ohmic electrodes (not denoted by a reference numeral) respectively provided on the p-gate layer 87 as a resistor.

A connection relationship between the islands 301 to 307 will be described with reference to FIG. 2. Since the same manner is also applied to islands provided in parallel with the islands 301 to 304, description thereof will be not repeated.

The power supply line 71 is connected from the Vgk terminal to the p-ohmic electrode 335 of the island 304 in which the resistor Rg1 is provided.

Next, the transfer signal line 72 is connected from the φ1 terminal to an n-ohmic electrode 325 of the transfer thyristor T1 provided in the island 303 via the current limiting resistor R1 provided in the island 306. The transfer signal line 72 is connected to the odd-numbered transfer thyristor T provided in the same manner as the island 306.

The transfer signal line 73 is connected from the φ2 terminal to an n-ohmic electrode (not denoted by a reference numeral) of the even-numbered transfer thyristor T provided in the same island as the island 303 via the current limiting resistor R2 provided in the island 307. In addition, the transfer signal line 73 is connected to the p-ohmic electrode 336 of the start diode SD.

The lighting signal line 74-$j$ is connected to the n-ohmic electrode 321-$j$ of the driving thyristor DT1$j$/the laser diode LD1$j$ (DT/LD1$j$) provided in the island 301-$j$.

The setting signal line 75 is connected to an n-ohmic electrode 323 of the setting thyristor S1 provided in the island 302.

The p-ohmic electrode 331-$j$ (see FIG. 4) of the driving thyristor DT1$j$/the laser diode LD1$j$ (DT/LD1$j$) of the island 301-$j$ and the n-ohmic electrode 322 of the connection diode Db1 of the island 302 are connected by the wiring 76.

The p-ohmic electrode 332 which is a gate Gs1 of the setting thyristor S1 of the island 302 and the n-ohmic electrode 324 of the connection diode Da1 of the island 303 are connected by a wiring 77.

The p-ohmic electrode 333 of the island 303, the p-ohmic electrode 334 of the resistor Rg1 of the island 304, and the n-ohmic electrode 327 of the start diode SD are connected by a wiring 79. The n-ohmic electrode 326 of the coupling diode D1 of the island 303 is connected to the gate Gt2 of the transfer thyristor T2 provided in the same island as the adjacent island 303 by the same wiring as the wiring 79.

As described above, mesa etching between the islands 302, 303, 304, 305, 306, and 307 is performed so that the p-anode layer 85 is exposed. The p-anode layer 85 is connected to the substrate 80 by the wiring 78. The wiring 78 is illustrated on the right side in FIG. 2 unlike the position of the wiring 78 in FIG. 5. That is, the wiring 78 is provided so as to connect the area 80A and the area 80B of the substrate 80.

Thyristor

Next, a basic operation of the thyristors (the transfer thyristor T, the setting thyristor S, and the driving thyristor DT) will be described. As illustrated in FIG. 5, the transfer thyristor T1 in the island 303 and the p-anode layer 85 of the setting thyristor S1 are connected to the substrate 80 and set to the reference potential Vsub. Hereinafter, the transfer thyristor T1 will be described as an example of a thyristor.

Figure 6A:
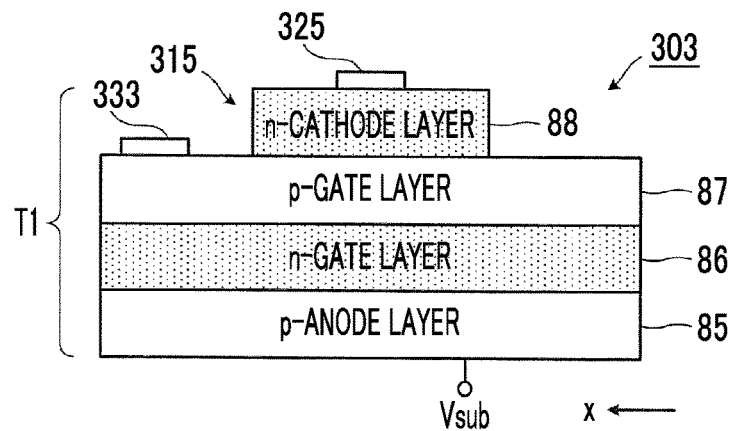
FIGS. 6A to 6C are diagrams for explaining an operation of a thyristor.
Figure 6B:
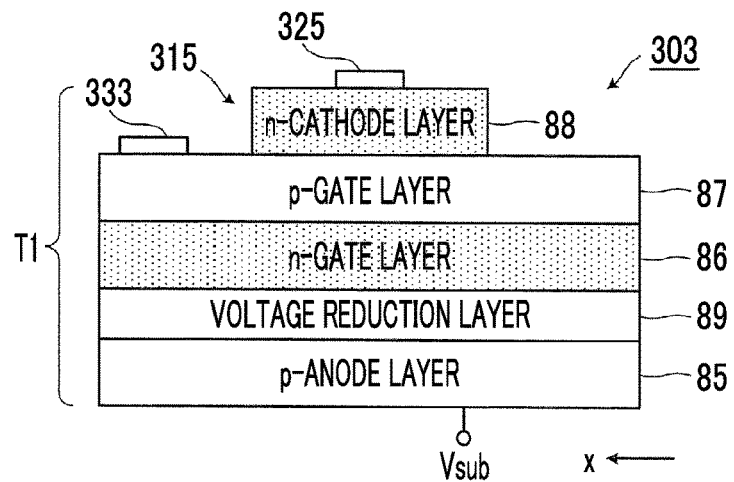
Figure 6C:
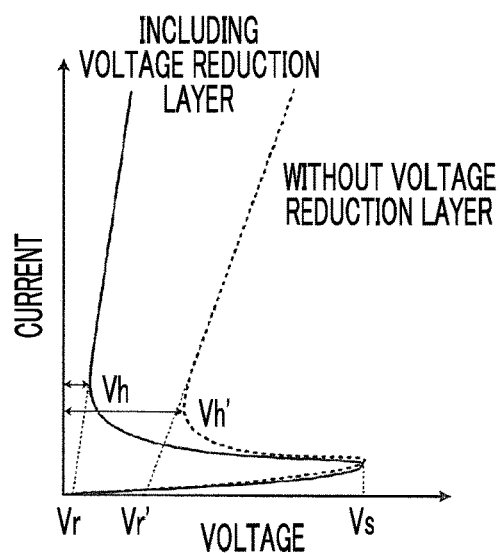

FIGS. 6A to 6C are diagrams for explaining an operation of a thyristor. FIG. 6A illustrates a case without the voltage reduction layer 89, FIG. 6B illustrates a case of providing the voltage reduction layer 89, and FIG. 6C illustrates a thyristor characteristic.

The thyristor illustrated in FIG. 6A is configured by laminating the p-anode layer 85, the n-gate layer 86, the p-gate layer 87, and the n-cathode layer 88. In the n-cathode layer 88, the n-cathode layer 88 is removed except for the area 315 so as to expose the p-gate layer 87. The n-ohmic electrode 325 is provided as a cathode on the area 315 of the n-cathode layer 88 and the p-ohmic electrode 333 is provided as a gate on the p-gate layer 87. The thyristor illustrated in FIG. 6B includes the voltage reduction layer 89. The p-anode layer 85 set to the reference potential Vsub is an anode.

As described above, the thyristor is a semiconductor element including three terminals of an anode, a cathode, and a gate. For example, the thyristor is configured by laminating a p-type semiconductor layer (the p-anode layer 85 and the p-gate layer 87), an n-type semiconductor layer (the n-gate layer 86 and the n-cathode layer 88) made of GaAs, GaAlAs, AlAs or the like. That is, the thyristor has a pnpn structure. Here, a pn-junction forward-potential (diffusion potential) Vd configured by a p-type semiconductor layer and an n-type semiconductor layer will be described as 1.5 V as an example.

First, an operation of the thyristor not including the voltage reduction layer 89 illustrated in FIG. 6A will be described. As an example, the reference potential Vsub of the p-anode layer 85 set to 0 V as a high level potential (hereinafter, referred to as "H") and the power supply potential Vgk, supplied to the Vgk terminal, set to -3.3 V as a low level potential (hereinafter, referred to as "L") will be described. Therefore, in some cases, "H" (0 V) and "L" (-3.3 V) are denoted. As illustrated in FIG. 1, the Vgk terminal is connected to a gate (the gate Gt1 in a case of the transfer thyristor T1) via the resistor Rg1.

The characteristic of the thyristor not including the voltage reduction layer 89 is "no voltage reduction layer" illustrated in FIG. 6C.

An off-state thyristor in which no current flows between an anode and a cathode shifts to an on-state (is turned on) in a case where a potential lower than a threshold voltage (a negative potential with a large absolute value) is applied to the cathode. Here, the threshold voltage of the thyristor is a value obtained by subtracting the pn-junction forward-potential Vd (1.5 V) from a potential of the gate.

In a case where the thyristor is turned on, the gate of the thyristor has a potential close to a potential of the anode. Here, since the anode is 0 V, the gate is assumed to be 0 V. In addition, the cathode of the thyristor in the on-state is a potential (the absolute value is denoted as a holding voltage) close to the potential obtained by subtracting the pn-junction forward-potential Vd (1.5 V) from the potential of the anode. Here, since the anode is 0 V, the cathode of the thyristor in the on-state becomes a potential (a negative potential with an absolute value larger than 1.5 V) close to −1.5 V (Vh' in FIG. 6C). Here, the holding voltage is assumed to be 1.5 V.

A potential (a negative potential with a large absolute value) lower than a potential necessary for maintaining the on-state is continuously applied to the cathode of the thyristor in the on-state. In a case where a current (sustained current) capable of maintaining the on-state is supplied, the on-state is maintained.

On the other hand, the cathode is set to a potential (a negative potential with a small absolute value, that is, 0 V or a positive potential) higher than a potential (a potential close to −1.5 V described above) necessary for maintaining the on-state of the cathode, the thyristor in the on-state shifts to the off-state (is turned off).

Next, an operation of the thyristor including the voltage reduction layer 89 illustrated in FIG. 6B will be described.

A rising voltage Vr (see FIG. 6C) in the thyristor is determined by energy (band gap energy) of the smallest a band gap in the semiconductor layer laminate constituting the thyristor. As illustrated in FIG. 6C, the rising voltage Vr in the thyristor is a voltage in a case where extrapolating a current of the thyristor in the on-state to a voltage axis.

The thyristor includes the voltage reduction layer 89 which is a layer having smaller band gap energy than the p-anode layer 85, the n-gate layer 86, the p-gate layer 87, and the n-cathode layer 88. Therefore, a rising voltage Vr of the thyristor is lower than the rising voltage Vr' of the thyristor not including the voltage reduction layer 89 illustrated in FIG. 6A. Further, the voltage reduction layer 89 is, for example, a layer having a band gap smaller than the band gap of the light emitting layer 82.

The thyristor (the transfer thyristor T, the setting thyristor S, and the driving thyristor DT) is not used as a light emitting element but is provided for driving a light emitting element such as a laser diode LD or the like. Therefore, the band gap is determined regardless of an emission wavelength of the light emitting element such as the laser diode LD or the like. By providing the voltage reduction layer 89 having a band gap smaller than the band gap of the light emitting layer 82, the rising voltage of the thyristor is reduced from Vr' to Vr (Vr'>Vr). Here, the rising voltages Vr and Vr' of the thyristor are described, but the same manner is also applied to the holding voltages Vh and Vh' which are voltages for maintaining the on-state of the thyristor (see FIG. 6C). That is, it is assumed that the holding voltage is from 1.5 V (Vh') in the case of not including the voltage reduction layer 89 to 0.8 V (Vh) in the case of including the voltage reduction layer 89.

On the other hand, a switching voltage Vs (see FIG. 6C) of the thyristor is determined by a depleted layer of the semiconductor layer which is a reverse bias. Therefore, the voltage reduction layer 89 slightly influences the switching voltage Vs of the thyristor.

Figure 7:
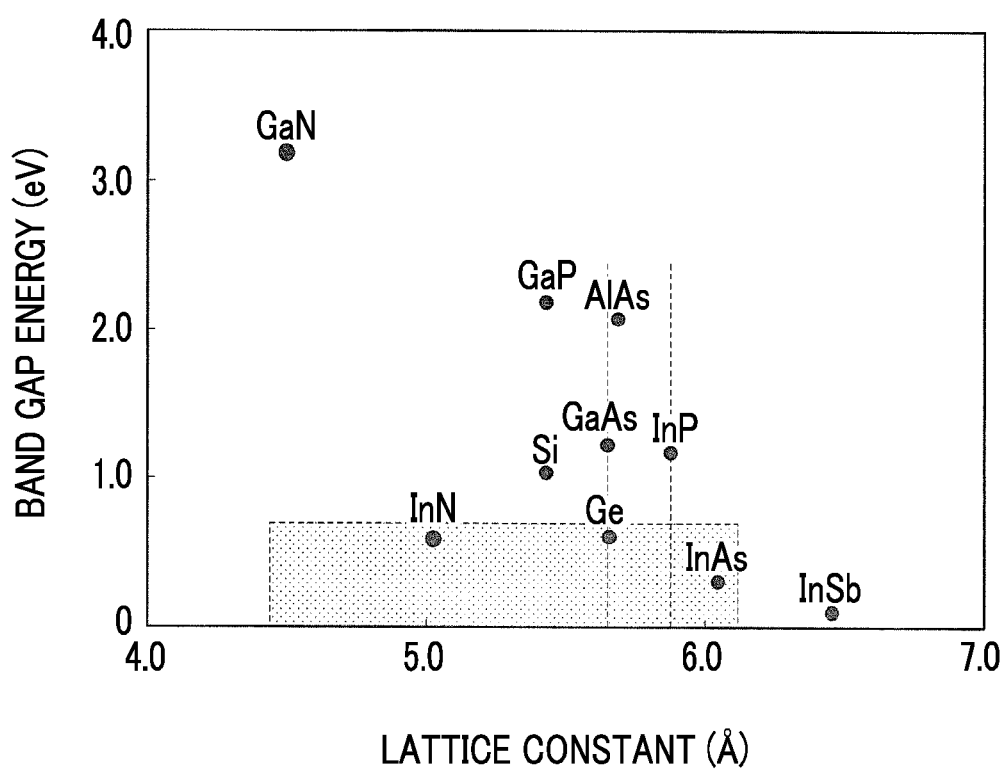
FIG. 7 is a diagram for explaining band gap energy of a material constituting a semiconductor layer.

FIG. 7 is a diagram for explaining band gap energy of a material constituting a semiconductor layer.

A lattice constant of GaAs is approximately 5.65 Å. A lattice constant of AlAs is approximately 5.66 Å. Therefore, a material close to the lattice constant can epitaxially grow on a GaAs substrate. For example, AlGaAs or Ge which are compounds of GaAs and AlAs can epitaxially grow on the GaAs substrate.

A lattice constant of InP is approximately 5.87 Å. A material close to the lattice constant can epitaxially grow on an InP substrate.

In addition, although a lattice constant of GaN varies according to growth surfaces, an a-surface is 3.19 Å and a c-surface is 5.17 Å. A material close to the lattice constant can epitaxially grow on a GaN substrate.

Regarding GaAs, InP, and GaN, materials of band gap energy at which the rising voltage of the thyristor is reduced are materials in a range indicated by halftone dots in FIG. 7. That is, in a case where a material in the range indicated by the halftone dots is used as a layer constituting the thyristor, the rising voltage Vr of the thyristor becomes band gap energy of the material of the area indicated by the halftone dots.

For example, band gap energy of GaAs is approximately 1.43 eV. Therefore, in a case of not using the voltage reduction layer 89, the rising voltage Vr of the thyristor is approximately 1.43 V. Meanwhile, by using the material in the range indicated by the halftone dots as a layer constituting the thyristor, or by including the material, the rising voltage Vr of the thyristor can be set to be higher than 0 V and lower than 1.43 V (0 V<Vr<1.43 V).

Accordingly, power consumption in a case where the thyristor is in the on-state is reduced.

As a material in the range indicated by the halftone dots, there is Ge having band gap energy of approximately 0.67 eV for GaAs. In addition, there is InAs having band gap energy of approximately 0.36 eV for InP. Further, regarding the GaAs substrate or the InP substrate, a material having small band gap energy can be used for a compound of GaAs and InP, a compound of InN and InSb, a compound of InN and InAs, and the like. Specifically, a mixed compound based on GaInNAs is appropriate. The compound may include Al, Ga, As, P, Sb, and the like. In addition, regarding GaN, GaNP can be the voltage reduction layer 89. Further, (1) an InN layer, an InGaN layer, and a GaNAs layer by metamorphic growth, (2) a quantum dot made of InN, InGaN, InNAs, InNSb, and GaNAs (3) an InAsSb layer corresponding to twice the lattice constant (a-surface) of GaN, and the like can be used as the voltage reduction layer 89. Al, Ga, N, As, P, Sb, and the like may be included.

That is, the voltage reduction layer 89 reduces the rising voltage while maintaining the switching voltage Vs of the thyristor. Accordingly, the holding voltage applied to the thyristor in the on-state is reduced, so that power consumption is reduced. The switching voltage Vs of the thyristor is set to a predetermined value by adjusting materials, an impurity concentration, or the like of the p-anode layer 85, the n-gate layer 86, the p-gate layer 87, and the n-cathode layer 88. However, the switching voltage Vs varies according to an insertion position of the voltage reduction layer 89.

In addition, although FIGS. 6A to 6C illustrate an example in which one voltage reduction layer 89 is provided, a plurality of voltage reduction layers 89 may be provided. For example, the voltage reduction layers 89 are respectively provided between the p-anode layer 85 and the n-gate layer 86, between the n-gate layer 86 and the p-gate layer 87, and between the p-gate layer 87 and the n-cathode layer 88 or one voltage reduction layers 89 may be provided in the n-gate layer 86 and another voltage reduction layers 89 may be provided in the p-gate layer 87. Alternatively, two or three layers from the p-anode layer 85, the n-gate layer 86, the p-gate layer 87, and the n-cathode layer 88 may be selected and the voltage reduction layers 89 are respectively provided in the respective layers. A conductivity type of these voltage reduction layers may be combined with the anode layer, the cathode layer, and the gate layer provided with the voltage reduction layer, or may be an i-type.

A material used as the voltage reduction layer 89 is difficult to grow and inferior in quality as compared with GaAs, InP, or the like. A defect tends to occur inside the voltage reduction layer 89, and the defect extends inside a semiconductor such as GaAs or the like growing on the voltage reduction layer 89, for example.

As described above, a light emitting characteristic of a light emitting element such as a laser diode LD is susceptible to the defect included in the semiconductor layer. On the other hand, the thyristor (the setting thyristor S and the transfer thyristor T) may be turned on so as to supply a current to the laser diode LD and a lower diode UD. In a case where the thyristor including the voltage reduction layer 89 is not used as a light emitting layer but is used for voltage reduction, a defect may be included in a semiconductor layer constituting the thyristor.

The laser diode LD and the same structure as the laser diode LD may be provided on the substrate 80 and the transfer thyristor T including the voltage reduction layer 89, the setting thyristor S, and the driving thyristor DT may be provided on the laser diode LD and the structure. Accordingly, occurrence of a defect in the laser diode LD is suppressed and the light emitting characteristic is less susceptible to the defect. In addition, the transfer thyristor T, the setting thyristor S, and the driving thyristor DT can be monolithically laminated.

Lamination Structure of Driving Thyristor DT and Laser Diode LD

Next, a lamination structure of the driving thyristor DT1$j$ and the laser diode LD1$j$ in the island 301-$j$ ($j$=1 to 4) illustrated in FIGS. 3A and 3B will be described. Here, a lamination structure of the driving thyristor DT1$j$ and the laser diode LD1$j$ will be described with a lamination structure of the driving thyristor DT11 and the laser diode LD11 as an example. In the lamination structure of the driving thyristor DT11 and the laser diode LD11, the reference potential Vsub is applied to the rear surface electrode 92 of the substrate 80 and the lighting signal φI1 is supplied to the lighting signal line 74-1 connected to the n-ohmic electrode 321-1 provided on the n-cathode layer 88. A gate voltage is applied to the p-ohmic electrode 331-1 which is a gate Gd11 provided on the p-gate layer 87 illustrated in FIG. 3B.

Hereinafter, it is assumed that the driving thyristor DT11 is denoted as the driving thyristor DT, the laser diode LD11 is denoted as the laser diode LD, the n-ohmic electrode 321-1 is denoted as the n-ohmic electrode 321, the lighting signal φI1 is denoted as a lighting signal φI, and a gate voltage applied to the gate Gd11 is denoted as a potential of a gate Gd.

The driving thyristor DT is laminated on the laser diode LD via the tunnel junction layer 84, and the driving thyristor DT and the laser diode LD are connected in series.

First, the tunnel junction layer 84 will be described.

Figure 8A:
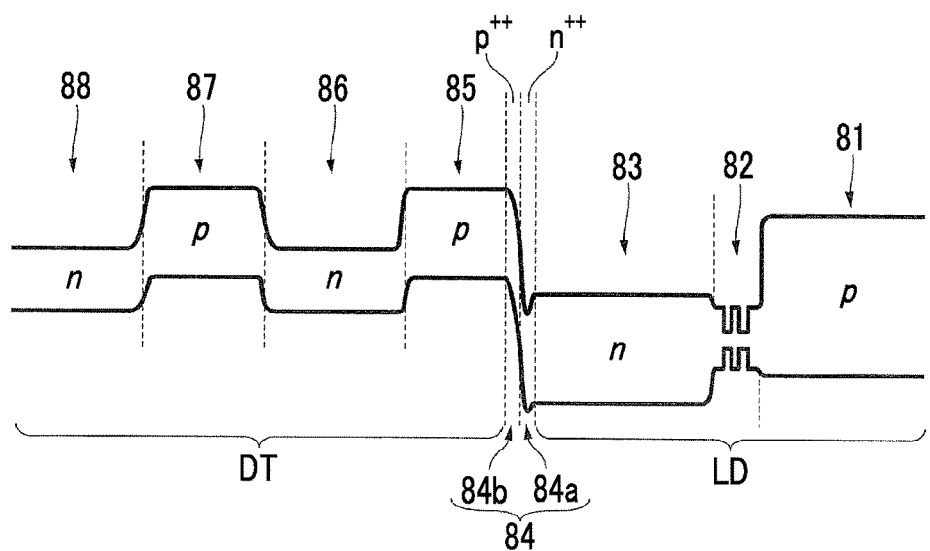
FIGS. 8A to 8C are diagrams for further explaining a lamination structure of the laser diode and the driving thyristor.
Figure 8B:
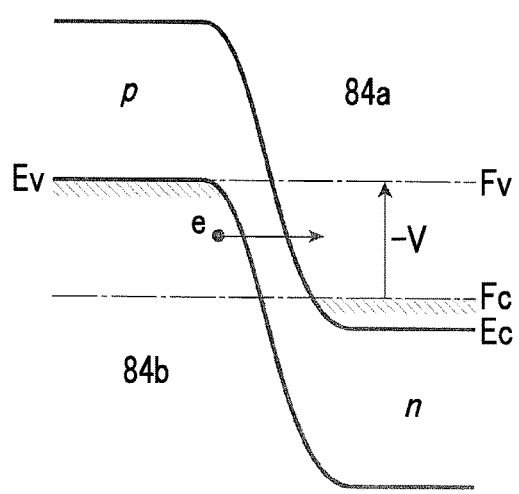
Figure 8C:
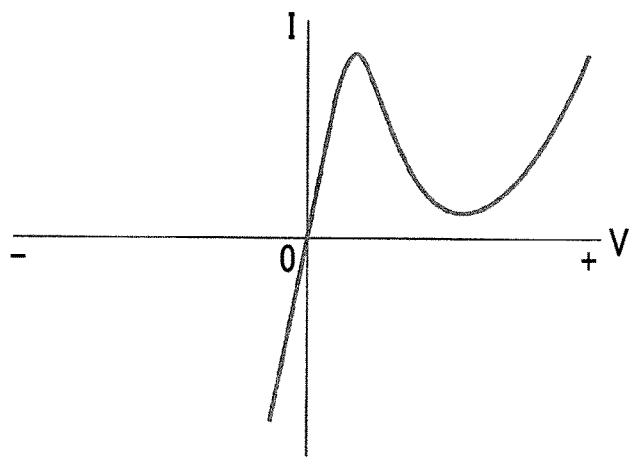

FIGS. 8A to 8C are diagrams for further explaining a lamination structure of the laser diode LD and the driving thyristor DT. FIG. 8A is a schematic diagram illustrating an energy band in the lamination structure of the laser diode LD and the driving thyristor DT, FIG. 8B is a diagram illustrating an energy band of the tunnel junction layer 84 in a reverse bias state, and FIG. 8C illustrates a current voltage characteristic of the tunnel junction layer 84. Description of the voltage reduction layer 89 will be not repeated.

As illustrated in the energy band diagram in FIG. 8A, in a case where a voltage is applied between the lighting signal φI applied to the n-ohmic electrode 321 and the reference potential Vsub of the rear surface electrode 92 illustrated in FIGS. 3A and 3B so that each of the laser diode LD and the driving thyristor DT is forward biased, a reverse bias is generated between an $n^{++}$ layer 84$a$ and a $p^{++}$ layer 84$b$ constituting the tunnel junction layer 84.

The tunnel junction layer 84 is a junction between the $n^{++}$ layer 84$a$ to which an n-type impurity is added at a high concentration and the $p^{++}$ layer 84$b$ to which a p-type impurity is added at a high concentration. For this reason, in a case where a width of a depletion area is narrow and forward bias occurs, an electron tunnels from a conduction band on a side of the $n^{++}$ layer 84$a$ to a valence band on a side of the $p^{++}$ layer 84$b$. At this time, a negative resistance characteristic appears (see a forward bias side (+V) in FIG. 8C).

On the other hand, as illustrated in FIG. 8B, in a case where the tunnel junction layer 84 is reverse biased (−V), a potential Ev of the valence band on the side of the $p^{++}$ layer 84$b$ is higher than a potential Ec of the conduction band on the side of the $n^{++}$ layer 84$a$. An electron tunnels from a valence band on a side of the $p^{++}$ layer 84$b$ to the conduction band on the side of the $n^{++}$ layer 84$a$. As a reverse bias voltage (−V) increases, the electron is more likely to tunnel. That is, as illustrated on a reverse bias side (−V) in FIG. 8C, in the tunnel junction layer 84 (tunnel junction), as the reverse bias increases, a current is more likely to flow.

As illustrated in FIG. 8A, in a case where the driving thyristor DT is turned on, even in a case where the tunnel junction layer 84 is reverse biased, a current flows between the laser diode LD and the driving thyristor DT.

Instead of the tunnel junction layer 84, a III-V compound layer having metallic conductivity and epitaxially growing in a III-V compound semiconductor layer may be used. InNAs described as an example of a material of a metallic-conductive III-V compound layer has negative band gap energy, for example, within a range in which a composition ratio x of InN is approximately 0.1 to approximately 0.8. In addition, InNSb has negative band gap energy, for example, within a range in which the composition ratio x of InN is approximately 0.2 to approximately 0.75. The negative band gap energy means that there is no band gap. Therefore, this indicates the same conductivity characteristic (a conduction characteristic) as a metal. That is, the metallic conductivity characteristic (conductivity) means that in a case where the potential has a gradient, a current flows in the same manner as a metal.

A lattice constant of the III-V compound (semiconductor) such as GaAs, InP, or the like is in a range of 5.6 Å to 5.9 Å. The lattice constant is close to approximately 5.43 Å of a lattice constant of Si and approximately 5.66 Å of a lattice constant of Ge.

On the contrary, a lattice constant of InN, which is the same III-V compound, is approximately 5.0 Å in a zincblende structure and a lattice constant of InAs is approximately 6.06 Å. A lattice constant of InNAs, which is a compound of InN and InAs, can be close to 5.6 Å to 5.9 Å of GaAs or the like.

In addition, a lattice constant of InSb, which is a III-V compound, is approximately 6.48 Å. Since the lattice constant of InN is approximately 5.0 Å, a lattice constant of InNSb, which is a compound of InSb and InN, can be close to 5.6 Å to 5.9 Å such as GaAs.

That is, InNAs and InNSb can be monolithically and epitaxially grown on a layer of the III-V compound (semiconductor) such as GaAs. Further, a layer of the III-V compound (semiconductor) such as GaAs can be monolithically laminated by epitaxial growth on a layer of InNAs or InNSb.

In a case where the laser diode LD and the driving thyristor DT are laminated so as to be connected in series via the metallic-conductive III-V compound layer instead of the tunnel junction layer 84, reverse bias between the n-cathode layer 83 of the laser diode LD and the p-anode layer 85 of the driving thyristor DT is suppressed.

Basic Operation of Driving Thyristor DT and Laser Diode LD

Next, a basic operation of the driving thyristor DT and the laser diode LD will be described.

Here, in the laser diode LD, the rising voltage is 1.5 V. That is, in a case where a voltage of 1.5 V or more is applied between the anode and the cathode of the laser diode LD, the laser diode LD is lighted (emitted).

In addition, a structure, in which the driving thyristor DT and the laser diode LD are connected in series, includes the current blocking area β in which a head series resistance component functions as the p-anode layer 81 or a current constriction layer of the p-anode layer 81 in the laser diode LD. Accordingly, voltages of the anode and the gate of the driving thyristor DT in the on-state increase by 0.8 V (holding voltage) from a voltage of the lighting signal φ1.

Here, the lighting signal φI is a negative potential (here, −3.5 V) with an absolute value is larger than 0 V, −3.1 V, −2.5 V, and −3.1 V. In the lighting signal φI, 0 V is a potential for turning off the laser diode LD, −3.1 V is a potential for turning on the laser diode LD from the off-state, and −2.5 V is a potential for maintaining the laser diode LD in the on-state, and −3.5 V is a potential for lighting (emitting) the laser diode LD in the on-state with a predetermined quantity of light.

In a case where the laser diode LD is switched from the off-state to the on-state, the lighting signal φI is set to −3.1 V. At this time, in a case where −1.5 V is applied to the gate Gd, a threshold value of the driving thyristor DT is −3 V, which is obtained by subtracting the pn-junction forward-potential Vd (1.5 V) from a potential (−1.5 V) of the gate Gd. Since the lighting signal φI is −3.1 V, the laser diode LD shifts from the off-state to the on-state. That is, the laser diode LD is lighted (emitted) by laser oscillation. Thus, since the voltage (the holding voltage) applied to the driving thyristor DT in the on-state is 0.8 V, 2.3 V is applied to the laser diode LD.

Next, the lighting signal φI is shifted from −3.1 V to −2.5 V. Thus, since the holding voltage of the driving thyristor DT in the on-state is 0.8 V, 1.7 V is applied to the laser diode LD. Since 1.7 V is equal to or larger than 1.5 V which is the rising voltage of the laser diode LD, the lighting (emission) is continued.

In a case where the lighting signal φI is −3.5 V, since the holding voltage of the driving thyristor DT in the on-state is 0.8 V, 2.7 V is applied to the laser diode LD. That is, the voltage applied to the laser diode LD is the highest, and the laser diode LD is in a state (a strong light emission state) in which a quantity of light is the highest.

In a case where the lighting signal φI is 0 V, 0 V is applied to the driving thyristor DT and the laser diode LD in a series connection manner, the driving thyristor DT shifts (is turned off) from the on-state to the off-state, and the laser diode LD is lighted off.

Details of an operation of the light emitting device 10 will be described below.

In a case where the driving thyristor DT shifts from the on-state to the off-state, a charge remains between an anode of the driving thyristor DT and a cathode of the laser diode LD. Meanwhile, a voltage between the anode of the driving thyristor DT and the cathode of the laser diode LD is a voltage (−1.5 V) lower than the reference potential Vsub (0 V) by the rising voltage (1.5 V) of the laser diode LD, the anode and the gate of the driving thyristor DT are electrically disconnected in the off-state and do not affect the switching voltage. Therefore, a stable operation of the driving thyristor DT is easily performed.

Configuration of Semiconductor Layer Laminate

The semiconductor layer laminate is configured by laminating the substrate 80, the p-anode layer 81, the light emitting layer 82, the n-cathode layer 83, the tunnel junction layer 84, the p-anode layer 85, the n-gate layer 86, the p-gate layer 87, and the n-cathode layer 88.

As described above, although the substrate 80 is described with p-type GaAs as an example, the substrate 80 may be n-type GaAs or GaAs of intrinsic (i) to which impurity is not added. In addition, a semiconductor substrate made of InP, GaN, InAs, other III-V, a II-VI material, sapphire, Si, Ge, or the like may be used. In a case where the substrate is changed, as a material monolithically laminated on the substrate, a material approximately matching (including a strain structure, a strain relaxation layer, metamorphic growth) a lattice constant of the substrate is used. As an example, InAs, InAsSb, GaInAsSb, and the like are used on an InAs substrate, InP, InGaAsP, and the like are used on an InP substrate, GaN, AlGaN, and InGaN are used on a GaN substrate or a sapphire substrate, and Si, SiGe, GaP, and the like are used on an Si substrate. However, in a case where the substrate 80 has an electrical insulation characteristic, it is necessary to additionally provide a wiring for supplying the reference potential Vsub. Further, in a case where a semiconductor layer laminate except for the substrate 80 is attached to another support substrate and the semiconductor layer laminate is provided on the other support substrate, it is not necessary that a lattice constant is matched with the support substrate.

The p-anode layer 81 is configured by sequentially laminating a lower p-anode layer, a current constriction layer, and an upper p-anode layer. The lower p-layer and the upper p-layer are, for example, p-type $Al_{0.9}GaAs$ having an impurity concentration of $5\times10^{17}/cm^3$. Al composition may be changed within a range of 0 to 1.

The current constricting layer is, for example, p-type AlGaAs having a high impurity concentration of AlAs or Al. Al is oxidized to form $Al_2O_3$ and an electric resistance is increased, so that the current blocking area β may be formed in current constricting layer. The current blocking area β may be formed by implanting hydrogen ions ($H^+$) into a semiconductor layer of GaAs, AlGaAs, or the like ($H^+$ ion implantation).

The light emitting layer 82 is quantum well composition in which a well layer and a barrier layer are alternately laminated. The well layer is, for example, GaAs, AlGaAs, InGaAs, GaAsP, AlGaInP, GaInAsP, GaInP, or the like, and the barrier layer is AlGaAs, GaAs, GaInP, GaInAsP, or the like. The light emitting layer 82 may be a quantum line (quantum wire) or a quantum box (quantum dot).

The tunnel junction layer 84 is configured to include a junction (see FIG. 8A) between the $n^{++}$ layer 84a to which an n-type impurity is added at a high concentration and the $p^{++}$ layer 84b to which a p-type impurity is added at a high concentration. The $n^{++}$ layer 84a and the $p^{++}$ layer 84b have high impurity concentrations of $1\times10^{20}/cm^3$, for example. An impurity concentration of a normal junction is in a range of $10^{17}/cm^3$ to $10^{18}/cm^3$. A combination (hereinafter, denoted as the $n^{++}$ layer 84a/the $p^{++}$ layer 84b) of the $n^{++}$ layer 84a and the $p^{++}$ layer 84b is, for example, $n^{++}$ GaInP/$p^{++}$ GaAs, $n^{++}$ GaInP/$p^{++}$ AlGaAs, $n^{++}$ GaAs/$p^{++}$ GaAs, $n^{++}$ AlGaAs/$p^{++}$ AlGaAs, $n^{++}$ InGaAs/$p^{++}$ InGaAs, $n^{++}$ GaInAsP/$p^{++}$ GaInAsP, $n^{++}$ GaAsSb/$p^{++}$ GaAsSb. The combination may be mutually changed.

The p-anode layer 85 is, for example, p-type $Al_{0.9}GaAs$ having an impurity concentration of $1\times10^{18}/cm^3$. The Al composition may be changed within a range of 0 to 1.

The n-gate layer 86 is, for example, n-type $Al_{0.9}GaAs$ having an impurity concentration of $1\times10^{17}/cm^3$. The Al composition may be changed within a range of 0 to 1.

The p-gate layer 87 is, for example, p-type $Al_{0.9}GaAs$ having an impurity concentration of $1\times10^{17}/cm^3$. The Al composition may be changed within a range of 0 to 1.

The n-cathode layer 88 is, for example, n-type $Al_{0.9}GaAs$ having an impurity concentration of $1\times10^{18}/cm^3$. The Al composition may be changed within a range of 0 to 1.

These semiconductor layers are laminated by, for example, metal organic chemical vapor deposition (MOCVD), molecular beam epitaxy (MBE), or the like, and the semiconductor layer laminate is formed.

Instead of the AlGaAs-based material described above, GaInP or the like may be used. Further, a GaN substrate or an InP type substrate may be used. In addition, the laser diode LD configured to include the p-anode layer 81, the light emitting layer 82, and the n-cathode layer 83 and the driving thyristor DT configured to include the p-anode layer 85, the n-gate layer 86, the p-gate layer 87, and the n-cathode layer 88 may be respectively formed by materials having different lattice constants. Metamorphic growth may be used or the laser diode LD and the driving thyristor DT may be separately grown and attached to each other so as to realize the laser diode LD and the driving thyristor DT. At this time, the tunnel junction layer 84 may be approximately matched to either of lattice constants.

Since the light emitting unit 100 can be manufactured by a known technology such as photolithography, etching, the description of the manufacturing method will be not repeated.

Operation of Light Emitting Device 10

FIG. 9 is a diagram illustrating an example of controlling lighting/non-lighting of the laser diode LD in the light emitting device 10. Here, a case where the laser diodes LD described in FIGS. 1, 2, and the like are arranged in 4×4 will be described as an example. In FIG. 9, the laser diode LD to be lighted (to be emitted) is indicated by "O" and the laser diode LD not to be lighted (is lighted off) is indicated by "X". Here, it is assumed that the laser diodes LD11, LD12, LD14, LD21, LD23, LD31, LD32, LD41, LD43, and LD44 are lighted (emitted) and the laser diodes LD13, LD22, LD24, LD33, LD34, and LD42 are not lighted (are lighted off).

That is, in a case of viewing the light emitting device 10, a state (an image) in which "O" parts in FIG. 9 is lighted (emitted) can be seen. The state illustrated in FIG. 9 corresponds to the state illustrated FIGS. 1 and 2 as it is.

Timing Chart

Figure 10:
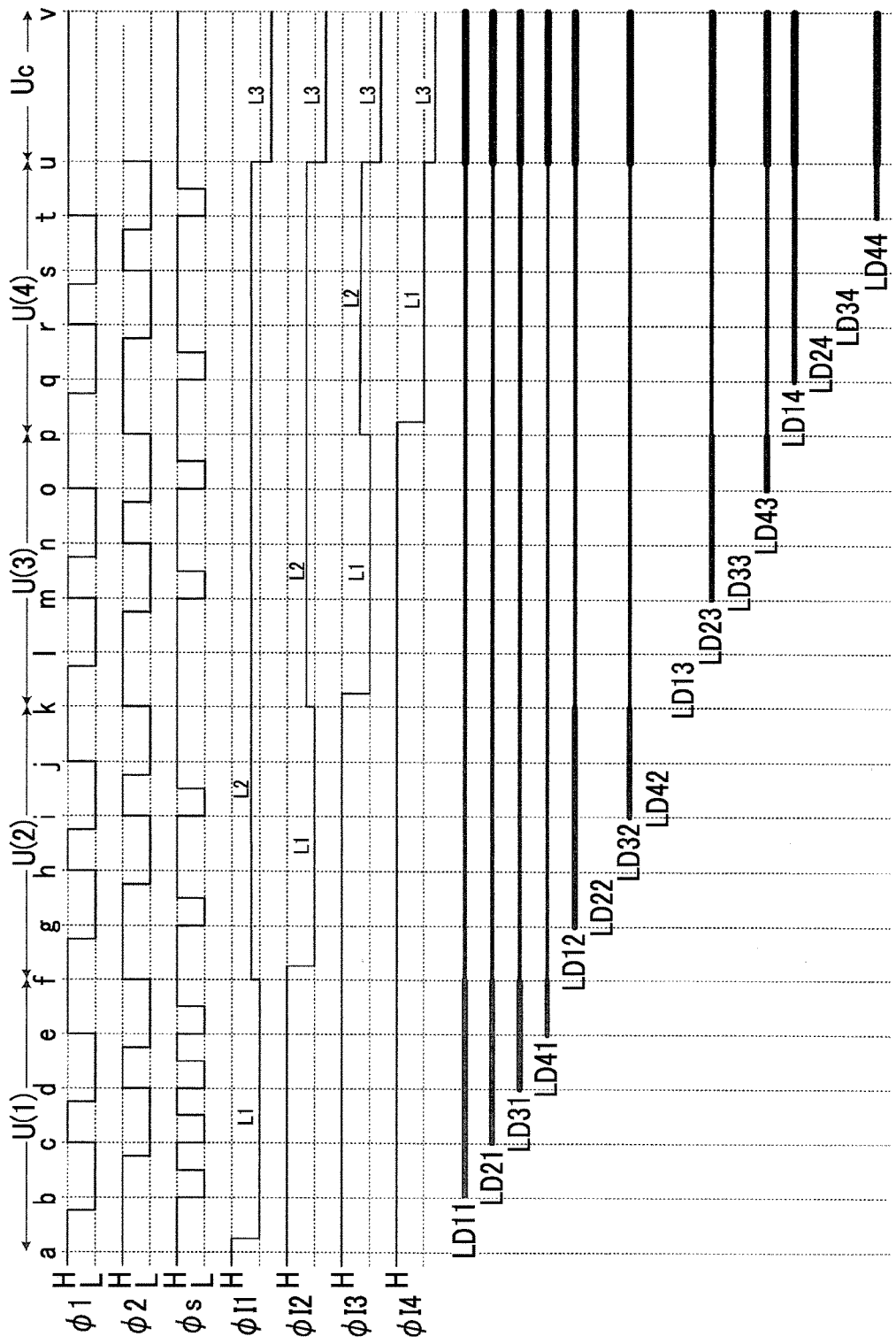
FIG. 10 is a timing chart for driving the light emitting device.

FIG. 10 is a timing chart for driving the light emitting device 10. The light emitting device 10 includes the laser diode LD in 4×4 and is controlled to be in the lighting/non-lighting state illustrated in FIG. 9. In FIG. 10, it is assumed that a time elapses in alphabetical order (a, b, c, . . . ). The timing chart illustrated in FIG. 10 provides setting periods U(1) to U(4) for determining whether to set the laser diode LD to be lighted or not and a lighting maintenance period Uc for maintaining a lighting state of the laser diode LD set to be lighted in parallel.

A time from a time a to a time f is the setting period U(1) related to the laser diodes LD11, LD21, LD31, and LD41, a time from the time f to a time k is the setting period U(2) related to the laser diodes LD12, LD22, LD32, and LD42, a time from the time k to a time p is the setting period U(3) related to the laser diodes LD13, LD23, LD33, and LD43, and a time from the time p to a time u is the setting period U(4) related to the laser diodes LD14, LD24, LD34, and LD44. A time from the time u to a time v is the lighting maintenance period Uc in a case where the laser diodes LD set to be lighted are maintained in the lighting state in parallel.

Here, in a case where the setting period U (1) is an example of a first period, the setting periods U (2) to U (4) is an example of a second period. In addition, the lighting maintenance period Uc is an example of a third period. Although FIG. 10 illustrated that the setting period U(1) is longer than the lighting maintenance period Uc, the lighting maintenance period Uc may be longer than the setting period U(1). As compared with a case where the setting period U(1) which is an example of the first period is longer than the lighting maintenance period Uc which is an example of the third period, a difference in the quantity of light emission depending on order of light emission of a plurality of laser diodes LD is reduced.

The flowchart illustrated in FIG. 10 will be described with reference to FIG. 1.

At the time a, a power is supplied to the control unit 110 illustrated in FIG. 1. Thus, the reference potential Vsub is set to "H (0 V)" and the power supply potential Vgk is set to "L (−3.3 V)".

Next, a waveform of each of the signals (the transfer signals φ1, φ2, the setting signal φs, and the lighting signals φI1, φI2, φI3, and φI4) will be described. Since the setting periods U(1), U(2), U(3), and U(4) are basically the same, the setting period U(1) will be mostly described.

The transfer signal φI is a signal having a potential of "H (0 V)" and "L (−3.3 V)". The transfer signal φI is "H (0 V)" at the time a during the setting period U(1) and shifts to "L (−3.3 V)" between the time a and a time b. The transfer signal φ1 returns to "H (0 V)" at a time c. During the time c to the time e, the time a to the time c are repeated. "H (0 V)" is maintained from the time e to the time f. In the transfer signal φ1, the setting period U(1) is repeated during the setting periods U(2) to U(4).

The transfer signal φ2 is a signal having a potential of "H (0 V)" and "L (−3.3 V)". The transfer signal φ2 is "H (0 V)" at the time a during the setting period U(1) and shifts to "L (−3.3 V)" between the time b and the time c. The transfer signal φ1 returns to "H (0 V)" at a time d. During the time d to the time f, the time b to the time d are repeated. In the transfer signal φ2, the setting period U(1) is repeated during the setting periods U(2) to U(4).

The setting signal φs is a signal having a potential of "H (0 V)" and "L (−3.3 V)". In a case where the laser diode LD illustrated in FIG. 9 is set to be lighted, the setting signal φs shifts from "H (0 V)" to "L (−3.3 V)". That is, the setting period U(1) is a period in a case where all of the laser diodes LD11, LD21, LD31, and LD41 are set to be lighted. The setting signal φs is "H (0 V)" at the time a and shifts to "L (−3.3 V)" at the time b so as to set the laser diode LD11 to be lighted. The setting signal φs returns to "H (0 V)" between the time b and the time c. Next, the setting signal φs shifts to "L (−3.3 V)" so as to set the laser diode LD21 to be lighted at the time c. The setting signal φs returns to "H (0 V)" between the time b and the time c. In the same manner, the setting signal φs shifts to "L (−3.3 V)" so as to set the laser diode LD31 to be lighted at the time d. The setting signal φs returns to "H (0 V)" between the time d and the time e. Further, the setting signal φs shifts to "L (−3.3

V)" so as to set the laser diode LD41 to be lighted at the time e. The setting signal φs returns to "H (0 V)" between the time e and the time f.

In a case where the laser diode LD is set not to be lighted, the setting signal φs does not shift from "H (0 V)" to "L (−3.3 V)". For example, during the setting period U(2), the laser diodes LD12 and LD32 are set to be lighted, and the laser diodes LD22 and L42 are set not to be lighted. Although the setting signal φs shifts to "L (−3.3 V)" at the times g and i, the setting signal φs maintains "H (0 V)" without shifting to "L (−3.3 V)" at the times h and j.

The same manner is also applied to the other setting periods U(3) and U(4).

That is, during the setting periods U(1) to U(4), the laser diodes LD to be lighted are sequentially lighted (emitted). At the time u in a case where sequential lighting is completed, the laser diode LD to be lighted is lighted (emitted) in parallel.

As described above, the lighting signals φI1, φI2, φI3, and φI4 are signals having four potentials of "H (0 V)", "L1 (−3.1 V)", "L2 (−2.5 V)", and "L3 (−3.5 V)".

First, the lighting signal φI1 will be described. The lighting signal φI1 is "H (0 V)" at the time a during the setting period U(1) and shifts to "L1 (−3.1 V)" between the time a and the time b. The setting period U(1) ends, and the lighting signal φI1 shifts to "L2 (−2.5 V)" at the time f in a case where the setting period U(2) starts. The setting period U(4) ends, and the lighting signal φI1 shifts to "L3 (−3.5 V)" at the time u in a case where the lighting maintenance period Uc starts. The lighting signal φI1 returns to "H (0 V)" at the time v in a case where the lighting maintenance period Uc ends.

The lighting signal φI2 is "H (0 V)" during the setting period U(1) and shifts to "L1 (−3.1 V)" between the time f and the time g during the setting period U(2). The setting period U(2) ends, and the lighting signal φI2 shifts to "L2 (−2.5 V)" at the time k in a case where the setting period U(3) starts. The setting period U(4) ends, and the lighting signal φI2 shifts to "L3 (−3.5 V)" at the time u in a case where the lighting maintenance period Uc starts. The lighting signal φI2 returns to "H (0 V)" at the time v in a case where the lighting maintenance period Uc ends.

The lighting signal φI3 is "H (0 V)" during the setting periods U(1) and U(2) and shifts to "L1 (−3.1 V)" between the time k and the time 1 during the setting period U(3). The setting period U(3) ends, and the lighting signal φI3 shifts to "L2 (−2.5 V)" at the time p in a case where the setting period U(4) starts. The setting period U(4) ends, and the lighting signal φI3 shifts to "L3 (−3.5 V)" at the time u in a case where the lighting maintenance period Uc starts. The lighting signal φI3 returns to "H (0 V)" at the time v in a case where the lighting maintenance period Uc ends.

The lighting signal φI4 is "H (0 V)" during the setting periods U(1), U (2), and U(3) and shifts to "L1 (−3.1 V)" between the time p and the time q during the setting period U(4). The setting period U(4) ends, and the lighting signal φI4 shifts to "L3 (−3.5 V)" at the time u in a case where the lighting maintenance period Uc starts. The lighting signal φI4 returns to "H (0 V)" at the time v in a case where the lighting maintenance period Uc ends. That is, the lighting signal φI4 does not include a period of "L2 (−2.5 V)".

As described above, the lighting signals φI1 to φI4 are waveforms shifted by the setting period U.

In a case of lighting the laser diodes LD11, LD21, LD31, LD41, LD12, LD22, LD32, LD42, LD13, LD23, LD33, LD43, LD14, LD24, LD34, and LD44, magnitude of a quantity of light is expressed by a thickness of a line. Where the line is not drawn, it means that the laser diode is not lighted, that is, the laser diode has the non-lighting state.

Next, apart of the flowchart illustrated in FIG. 10 will be described with reference to FIGS. 1 to 9.

Figure 11A:
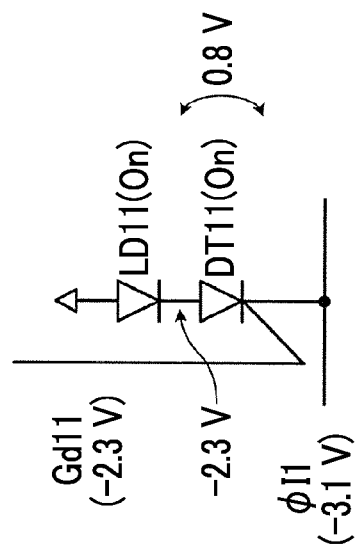
FIGS. 11A to 11C are diagrams for explaining an operation of the driving thyristor and the laser diode in the light emitting device at approximately a time b in FIG. 10.
Figure 11B:
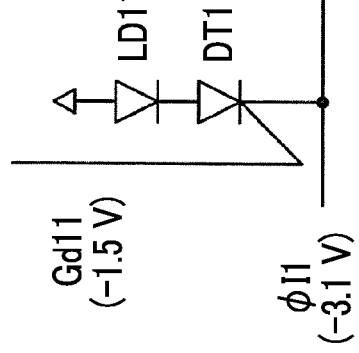
Figure 11C:
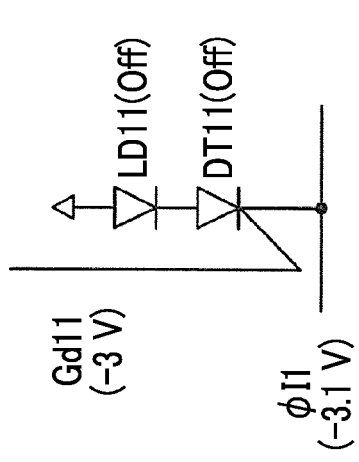

FIGS. 11A to 11C are diagrams for explaining an operation of the driving thyristor DT11 and the laser diode LD11 in the light emitting device 10 at approximately the time b in FIG. 10. FIG. 11A illustrates a state in which the setting signal φs is "H (0V)", FIG. 11B illustrates a state in which the setting signal φs shifts to "L (−3.3 V)", and FIG. 11C illustrates a state in which the setting signal φs returns to "H (0 V)".

At the time a, a power is supplied to the control unit 110 illustrated in FIG. 1, and the reference potential Vsub is set to "H (0 V)" and the power supply potential Vgk is set to "L (−3.3 V)". Thus, the transfer signals φI and φ2 are set to "H (0V)". In the start diode SD, the power supply potential Vgk ("L (−3.3 V)") is supplied to a cathode via the resistor Rg1 and the transfer signal φ2 of "H (0 V)" is supplied to an anode via the current limiting resistor R2. The start diode SD is forward biased, and the gate Gt1 of the transfer thyristor T1 becomes −1.5 V. Accordingly, a threshold voltage of the transfer thyristor T1 is −3 V.

As illustrated in FIG. 10, immediately before the time b, the transfer signal φI shifts from "H (0 V)" to "L (−3.3 V)". At this time, since the threshold voltage of the transfer thyristor T1 is −3 V, the transfer thyristor T1 is turned on and shifts from the off-state to the on-state. Thus, the gate Gt1 becomes 0 V. Accordingly, the gate Gs1 of the setting thyristor S1 having the gate Gt1 connected to the connection diode Da1 is −1.5 V. A threshold voltage of the setting thyristor S1 is −3 V. Meanwhile, since the gate Gs1 is −1.5 V, the gates Gd11, Gd12, Gd13, and Gd14 of the driving thyristors DT11, DT12, DT13, and DT14 connected to the gate Gs1 via the connection diode Db1 are −3 V. Therefore, threshold voltages of the driving thyristors DT11, DT12, DT13, and DT14 are −4.5 V.

At this time, between the time a and the time b, since the lighting signal φI1 already shifts from "H (0 V)" to "L1 (−3.1 V)" but a threshold voltage of the driving thyristor DT11 to which the lighting signal φI1 is supplied is −4.5 V, the driving thyristor DT11 is not turned on and maintains the non-lighting (the off-state). Therefore, the laser diode LD11 also maintains the non-lighting (the off-state).

As illustrated in FIG. 11B, in a case where the setting signal φs shifts from "H (0 V)" to "L (−3.3 V)" at the time b, the setting thyristor S1 having a threshold voltage of −3 V is turned on and shifts from the off-state to the on-state. Thus, the gate Gs1 of the setting thyristor S1 becomes 0 V. Accordingly, the gates Gd11, Gd12, Gd13, and Gd14 of the driving thyristors DT11, DT12, DT13, and DT14 connected to the gate Gs1 via the connection diode Db1 are −1.5 V. The threshold voltages of the driving thyristors DT11, DT12, DT13, and DT14 are −3 V.

At this time, since the lighting signal φI1 is "L (−3.3 V)", the driving thyristor DT11 is turned on and shifts from the off-state to the on-state. As described above, since the holding voltage of the driving thyristor DT11 in the on-state is 0.8 V, 2.3 V is applied to the laser diode LD11. Since the rising voltage of the laser diode LD11 is 1.5V, the laser diode LD11 also shifts from the off-state to the on-state and is lighted (emitted).

That is, the setting thyristor S is set to be in a state in which the setting thyristor S can shift to the on-state by the transfer thyristor T being turned on. The driving thyristor DT is set to be in a state in which the driving thyristor DT can shift to the on-state by the setting thyristor S being turned on.

As illustrated in FIG. 11C, in a case where the setting signal φs shifts from "L (−3.3 V)" to "H (0 V)" between the time b and the time c, the setting thyristor S1 is turned off and shifts from the on-state to the off-state. Thus, the gate Gs1 becomes −1.5 V. Meanwhile, the driving thyristor DT11 and the laser diode LD11 are in the on-state. At this time, since the holding voltage of the driving thyristor DT11 is 0.8 V, 2.3 V is applied to the laser diode LD11. That is, a potential of a cathode of the driving thyristor DT11 is −2.3 V. Therefore, the gate Gd11 of the driving thyristor DT11 is −2.3 V.

At this time, the gate Gd12 of the driving thyristor DT12, the gate Gd13 of the driving thyristor DT13, and the gate Gd14 of the driving thyristor DT14 are connected to the gate Gd11 (see FIG. 1). Therefore, threshold voltages of the driving thyristors DT12, DT13, and DT14 are −3.8 V. For example, even in a case where the lighting signals φl2, φl3, and φl4 are "L3 (−3.5 V)", the driving thyristors DT12, DT13, and DT14 are not turned on and the driving thyristors DT12, DT13, and DT14 are not lighted (emitted). That is, a state, in which only the laser diode LD11 is lighted (emitted) in the on-state, is maintained.

In a case where the transfer signal φ1 shifts from "H (0 V)" to "L (−3.3 V)" between the time a and the time b, the transfer thyristor T1 is turned on. At this time, since a potential of the gate Gt1 is "H (0V)", a potential of the gate Gt2 of the transfer thyristor T2 connected via the coupling diode D1 is −1.5 V. Therefore, a threshold voltage of the transfer thyristor T2 is −3 V.

In a case where the transfer signal φ2 shifts from "H (0 V)" to "L (−3.3 V)" between the time b and the time c, the transfer thyristor T2 is turned on. Therefore, a potential of the gate Gs2 of the setting thyristor S2 becomes −1.5 V, and a threshold voltage of the setting thyristor S2 becomes −3 V. In the same manner as the time b, at the time c, the setting signal φs shifts from "H (0 V)" to "L (−3.3 V)", so that the driving thyristor DT21 is turned on and the laser diode LD21 is lighted. The same manner is applied to the following.

As described above, the transfer thyristors T are sequentially shifted to the on-state by overlapping the periods of "L (−3.3 V)" in the transfer signals φ1 and φ2. The gate terminal Gt of the transfer thyristor T in the on-state is 0 V, so that a potential of the gate Gs of the setting thyristor S connected via the connection diode Da1 is set to −1.5 V. That is, a threshold voltage of the setting thyristor S is −3 V. The setting signal φs shifts from "H (0 V)" to "L (−3.3 V)", the setting thyristor S shifts from the off-state to the on-state. The gate Gs is 0 V, so that a potential of the gate Gd of the driving thyristor DT connected via the connection diode Db1 is set to −1.5 V. That is, a threshold voltage of the driving thyristor DT is −3 V. The driving thyristor DT to which the lighting signal φl of "L1 (−3.1 V)" is supplied is turned on, so that the laser diode LD connected to the driving thyristor DT is lighted.

FIGS. 12A to 12C are diagrams for explaining an operation of two pairs (a pair of the driving thyristor DT11 and the laser diode LD11 and a pair of the driving thyristor DT12 and the laser diode LD12) of the driving thyristor DT and the laser diode LD in the light emitting device 10 at approximately the time f in FIG. 10. FIG. 12A illustrates a state in which the lighting signal φl1 is "L1 (−3.1 V)", FIG. 12B illustrates a state in which the lighting signal φl1 shifts to "L2 (−2.5V)", and FIG. 12C illustrates a state in which the lighting signal φl2 shifts to "L1 (−3.1 V)".

FIG. 12A illustrates the state of FIG. 11C. That is, the lighting signal φl1 is "L1 (−3.1 V)" and the setting signal φs is "H (0 V)". For this reason, the driving thyristor DT11 and the laser diode LD11 are in the on-state and potentials of the gates Gd11 and Gd12 are −2.3 V. At this time, the threshold voltage of the driving thyristor DT12 in the off-state is −3.8 V.

At this time, the lighting signal φl2 is "H (0 V)". Therefore, the driving thyristor DT12 is not turned on, and the laser diode LD12 is in the off-state and is not lighted.

As illustrated in FIG. 12B, at the time f in FIG. 10, the lighting signal φl1 shifts from "L1 (−3.1 V)" to "L2 (−2.5 V)". Thus, since the holding voltage of the driving thyristor DT11 is 0.8 V, a voltage applied to the laser diode LD11 is 1.7 V. Meanwhile, since the rising voltage of the laser diode LD11 is 1.5 V, the laser diode LD11 is continued to be light. Since the voltage decreases, a quantity of light decreases. The potentials of the gates Gd11 and Gd12 are Therefore, the threshold voltage of the driving thyristor DT12 is −3.2 V. The same manner is applied to the driving thyristors DT13 and DT14.

As illustrated in FIG. 12C, between the time f and the time g in FIG. 10, the lighting signal φl2 shifts from "H (0 V)" to "L1 (−3.1 V)". Meanwhile, since the threshold voltage of the driving thyristor DT12 to which the lighting signal φl2 is supplied is −3.2 V, the driving thyristor DT12 cannot be turned on.

That is, the driving thyristor DT12 is not turned on unless the setting signal φs shifts from "H (0 V)" to "L (−3.3 V)" and the setting thyristor S1 is turned on. As described above, even in a case where the laser diode LD11 is in the on-state, a malfunction does not occur in the laser diodes LD12, LD13, and LD14 having the gates (the gates Gd12, Gd13, and Gd14) connected to the gate Gd11 of the laser diode LD11.

FIGS. 13A and 13B are diagrams for explaining an operation of three pairs (a pair of the driving thyristor DT21 and the laser diode LD21, a pair of a driving thyristor DT22 and a laser diode LD22, and a pair of a driving thyristor DT23 and a laser diode LD23) of the driving thyristor DT and the laser diode LD in the light emitting device 10 at approximately the time m in FIG. 10. FIG. 13A illustrates a state in which the setting signal φs is "H (0 V)" and FIG. 13B illustrates a state in which the setting signal φs shifts to "L (−3.3 V)".

As illustrated in FIG. 9, the laser diode LD21 is set to be in the on-state, the laser diode LD22 is set to be in the off-state, and the laser diode LD23 is set to be in the on-state.

As illustrated in FIG. 13A, immediately before the time m during the setting period U(3), the lighting signals φl1 and φl2 are "L2 (−2.5 V)". The lighting signal φl3 is "L1 (−3.1 V)". At this time, the driving thyristor DT21 and the laser diode LD21 are in the on-state and the driving thyristor DT22 and the laser diode LD22 are in the off-state. The driving thyristor DT23 and the laser diode LD23 are in the off-state.

Therefore, the gates Gd21, Gd22, and Gd23 connected with one another are −1.7 V. Threshold voltages of the driving thyristors DT22 and DT23 are −3.2 V. Even in a case where the lighting signal φl3 is "L1 (−3.1 V)", the driving thyristor DT23 is not turned on.

As illustrated in FIG. 13B, at the time m in FIG. 10, setting signal φs shifts from "H (0 V)" to "L (−3.3 V)". Thus, the setting thyristor S2 is turned on. The gate Gs2 of the setting thyristor S2 is 0 V, and potentials of the gates Gd21, Gd22, and Gd23 are −1.5 V via a connection diode Db2. That is, the threshold voltages of the driving thyristors DT22 and DT23 are −3 V. The driving thyristor DT21 is already in the on-state. In addition, since the lighting signal φl2 supplied to the driving thyristor DT22 is "L2 (−2.5 V)", the driving thyristor DT22 is not turned on. On the other hand, since the lighting signal φI3 supplied to the driving thyristor DT23 is "L1 (−3.1 V)", the driving thyristor DT23 is turned on and has the on-state, and the laser diode LD23 is in the on-state and lighted (emitted). The gates Gd21, Gd22, and Gd23 have −2.3 V. Accordingly, since the threshold voltage of the driving thyristor DT22 is −3.8 V, the driving thyristor DT22 is not turned on by the lighting signal φI2 of −2.5 V.

As described above, even in a case where another driving thyristor DT (the laser diode LD) set to be in the on-state or/and the off-state is connected to the commonly connected gate Gd and even in a case where the setting signal φs shifts from "H (0 V)" to "L (−3.3 V)" and a certain driving thyristor DT is turned on, a state of the driving thyristor DT does not affect the state of the other driving thyristor DT (the laser diode LD).

FIGS. 14A and 14B are diagrams for explaining an operation of two pairs (a pair of the driving thyristor DT12 and the laser diode LD12 and a pair of the driving thyristor DT13 and the laser diode LD13) of the driving thyristor DT and the laser diode LD in the light emitting device 10 at approximately the time u in a case where the lighting maintenance period Uc starts in FIG. 10. FIG. 14A illustrates a state in which lighting signals φI2 and φI3 are "L2 (−2.5 V)" and FIG. 14B illustrates a state in which the lighting signals φI2 and φI3 shift to "L3 (−3.5 V)".

As illustrated in FIG. 9, the laser diode LD12 is set to be in the on-state and the laser diode LD13 is set to be in the off-state. The laser diodes LD11 and LD14 connected to the driving thyristors DT11 and DT14 having the common gate Gd are also in the on-state. Meanwhile, since it is appropriate to describe a state in which the on-state and the off-state are different from each other, description of the laser diodes LD11 and LD14 will not be repeated.

As illustrated in FIG. 14A, since the laser diode LD12 is in the on-state, the gates Gd12 and Gd13 have −1.7 V. The threshold voltage of the driving thyristor DT13 in the off-state is −3.2 V.

As illustrated in FIG. 14B, at the time u, in a case where the lighting signals φI2 and φI3 shift from "L2 (−2.5 V)" to "L3 (−3.5 V)", the holding voltage of the driving thyristor DT12 is 0.8 V, so that a voltage applied to the laser diode LD12 is −2.7 V. The potentials of the gates Gd12 and Gd13 is −2.7 V. The threshold voltage of the driving thyristor DT13 in the off-state is −4.2 V. Even in a case where the lighting signal φI3 is "L3 (−3.5 V)", the driving thyristor DT13 is not turned on and the off-state is maintained. Therefore, the laser diode LD13 is also maintained in the off-state and is not lighted (emitted).

That is, even in a case where the light emitting unit 100 includes a laser diode LD set to be lighted and a laser diode LD set not to be lighted and even in a case where the lighting signal φI shifts to "L3 (−3.5 V)" which a negative value having a large absolute value, a malfunction does not occur.

As described above, the light emitting device 10 operates based on the flowchart illustrated in FIG. 10. In order to light off the lighting laser diode LD, all of the lighting signals φI may be set to "H (0 V)" at the time v. That is, by repeatedly performing the operation from the time a to the time v, the lighting/non-lighting of the laser diode LD is controlled in chronological order.

In the above description, "L1 (−3.1 V)" and "L3 (−3.5 V)" are denoted by different potentials, but "L1" and "L3" may be the same potential.

Further, in order to stabilize an operation of the light emitting unit 100, the gate Gs and the power supply potential Vgk, and the gate Gd (the wiring 76) and the power supply potential Vgk may be connected via a resistor.

In addition, the coupling diode D may be configured as a transistor. Further, a diode may be connected in series to the setting thyristor S and an anode side of the transfer thyristor T. In accordance with these changes, in order to adjust respective driving voltages, a diode or a resistor may be added in the light emitting unit 100 and the operation may be stabilized. Further, by providing a resistance component between the p-gate layer 87 of the driving thyristor DT and the wiring 76, a voltage of the gate Gd of the driving thyristor DT in the on-state may be made difficult to affect a gate Gd of another driving thyristor DT, sharing the wiring 76, in the on-state.

A plurality of pads (the φI terminal, the φ2 terminal, the Vgk terminal, the φs terminal, and the φIj terminal) may be provided approximately parallel to arrangement of the transfer thyristors T on the substrate 80 of the light emitting device 10. In this manner, according to arrangement of a plurality of laser diodes LD, currents or/and voltages are uniformly supplied.

Further, by providing a thick film insulating film such as benzocyclobutene (BCB) on the transfer element unit 105 (see FIG. 1), and providing a plurality of terminals (the φ1 terminal, the φ2 terminal, the Vgk terminal, the φs terminal, and the φIj terminal) on the thick film insulating film, it is possible to reduce a size and cost. In addition, light from the transfer thyristor T and the setting thyristor S is blocked.

In the present exemplary embodiment, the number of the transfer thyristors T and the number of the setting thyristors S are the same as i, but in order to increase a driving speed, a plurality of setting thyristors S may be connected to the transfer thyristors T or a plurality of setting signal lines 75 may be provided. Further, a plurality of light emitting units 100 may be arranged side by side and may be driven in parallel on an identical substrate or on a plurality of divided substrates. In this manner, the driving speed is increased.

Optical Measurement Apparatus 1

The light emitting device 10 described above can be used for optical measurement.

FIG. 15 is a diagram for explaining an optical measurement apparatus 1 using the light emitting device 10.

The optical measurement apparatus 1 includes the light emitting device 10 described above, a light receiving unit 20 which receives light, and a processing unit 30 which processes data. A measurement target (object to be measured) 40 is provided on an opposite side of the optical measurement apparatus 1. In FIG. 15, the measurement target 40 is a person as an example. FIG. 15 is a view as seen from above.

As described above, the light emitting device 10 lights on the two-dimensionally arranged laser diodes LD so as to emit light spreading in a conical shape around the light emitting device 10 as indicated by a solid line. At this time, a plurality of lighting signals φIj may be simultaneously set to "L1 (−3.1 V)" or "L3 (−3.5 V)" as the setting period U(1) or the lighting maintenance period Uc from the first.

The light receiving unit 20 is a device which receives light reflected by the measurement target 40. The light receiving unit 20 receives light directed to the light receiving unit 20 as indicated by a broken line. The light receiving unit 20 may be an imaging device which receives light from a two-dimensional direction.

The processing unit 30 is configured as a computer having an input/output unit which inputs and outputs data. The processing unit 30 processes information on the light so as to calculate a distance to the measurement target 40 and a three-dimensional shape of the measurement target 40.

The processing unit 30 of the optical measurement apparatus 1 controls the light emitting device 10 and causes the light emitting device 10 to emit light during a short period. That is, the light emitting device 10 emits the light in a pulse shape. Based on a time difference between a timing (time) in a case where the light emitting device 10 emits light and a timing (time) in a case where the light receiving unit 20 receives the reflected light from the measurement target 40, the processing unit 30 calculates an optical path length since the light emitting device 10 emits light until the light is reflected by the measurement target 40 and reaches the light receiving unit 20. Positions of the light emitting device 10 and the light receiving unit 20 or an interval between the light emitting device 10 and the light receiving unit 20 is predetermined. The processing unit 30 measures (calculates) distances from the light emitting device 10 and the light receiving unit 20 or a distance from a point as a reference (a reference point) to the measurement target 40. The reference point is a point provided at a predetermined position from the light emitting device 10 and the light receiving unit 20.

This method is a surveying method based on a reaching time of light and is called a time of flight (TOF) method.

In a case where the method is applied to a plurality of points on the measurement target 40, a three-dimensional shape of the measurement target 40 is measured. As described above, the light emitted from the light emitting device 10 two-dimensionally spreads and is irradiated on the measurement target 40. The reflected light from a portion of the measurement target 40 having a short distance to the light emitting device 10 is quickly incident on the light receiving unit 20. In a case of using an imaging device which obtains the two-dimensional image described above, a bright spot is recorded at a portion, in which the reflected light reaches, of a frame image. From the bright spots recorded in a series of a plurality of frame images, the optical path length is calculated for each of the bright spots. The distance from the light emitting device 10 and the light receiving unit 20 or the distance from the point as a reference (reference point) is calculated. That is, a three-dimensional shape of the measurement target 40 is calculated.

In addition, the light emitting device 10 according to the present exemplary embodiment may be also used for an optical surveying method using a structured light method, as another method. A device to be used is nearly the same as the optical measurement apparatus 1 using the light emitting device 10 illustrated in FIG. 15. There is a difference in that a pattern of light irradiated on the measurement target 40 is a numerous number of light dots (a random pattern) and the light receiving unit 20 receives the light. The processing unit 30 processes information on the light. Here, as a method of the process, instead of obtaining the time difference described above, a distance to the measurement target 40 or the three-dimensional shape of the measurement target 40 is calculated by calculating a positional deviation amount of the numerous number of light dots. A two-dimensional VCSEL array or the like randomly arranged is used as a light source used for a method in the related art, but a random irradiated-pattern is approximately 1 to 4 predetermined patterns (a structured fix method). On the other hand, in the light emitting device 10 according to the present exemplary embodiment, the light dot to be irradiated can be freely set according to a signal from an outside, so that the light can be irradiated with more random patterns.

As described above, the optical measurement apparatus 1 can be applied to calculation of a distance to an article. In addition, the article can be identified by calculating a shape of the article. A face of a person can be identified (face authentication) by calculating a shape of the face of the person. Further, the optical measurement apparatus 1 can be applied for detecting an obstacle in front, rear, lateral, or the like by loading the optical measurement apparatus 1 in a car. As described above, the optical measurement apparatus 1 can be widely used for calculation of a distance, a shape, and the like.

Image Forming Apparatus 2

The light emitting device 10 described above can be used for an image forming apparatus 2 which forms an image.

Figure 16:
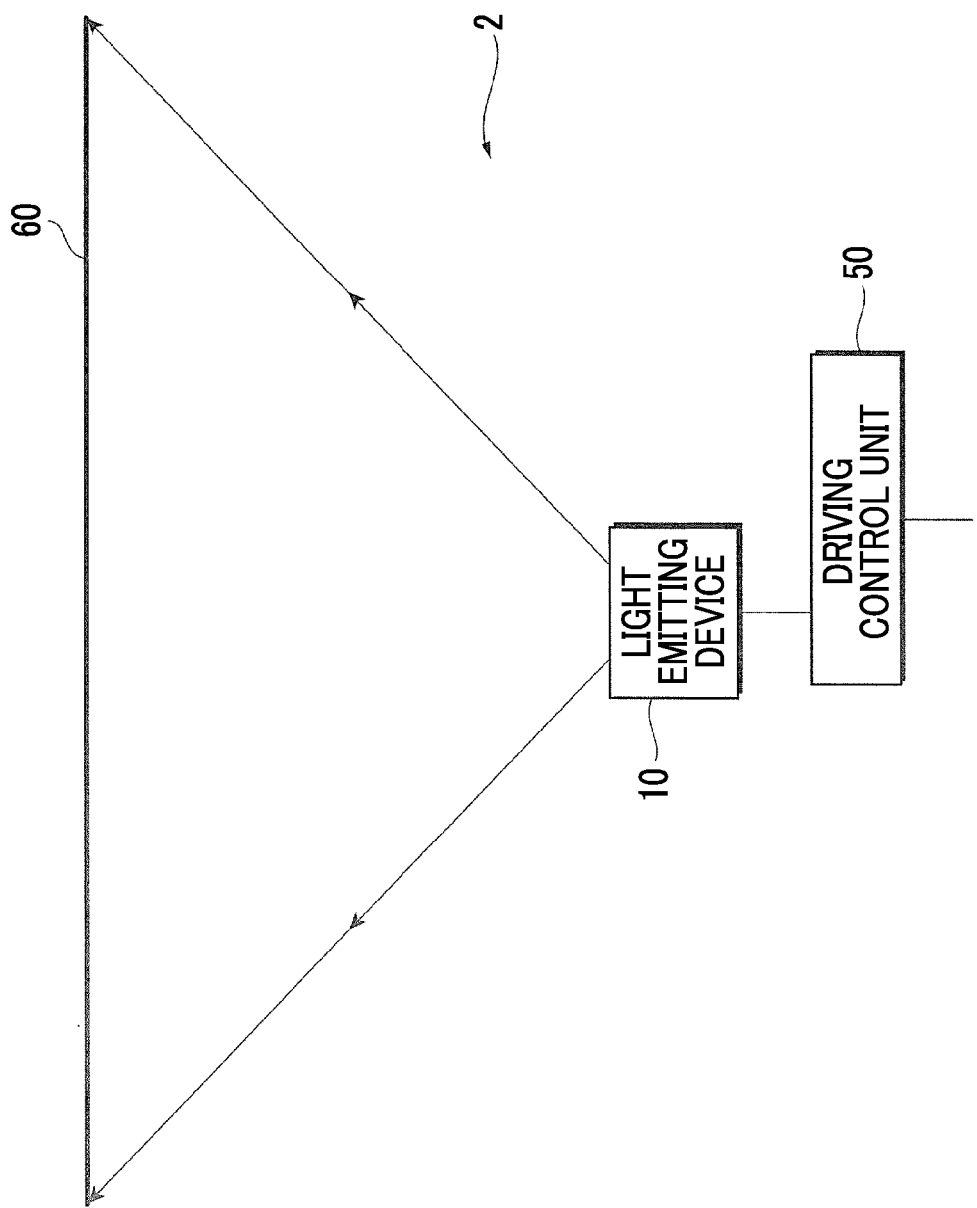
FIG. 16 is a diagram for explaining an image forming apparatus using the light emitting device.

FIG. 16 is a diagram for explaining the image forming apparatus 2 using the light emitting device 10.

The image forming apparatus 2 includes the light emitting device 10 described above, a driving control unit 50, and a screen 60 which receives light.

An operation of the image forming apparatus 2 will be described.

As described above, the light emitting device 10 sets the two-dimensionally arranged laser diodes LD to lighting/non-lighting. During the lighting maintenance period Uc, the laser diodes LD are lighted in parallel. That is, a two-dimensional still image (two-dimensional image) is obtained. In order to receive an input of an image signal and form a two-dimensional image, the driving control unit 50, which drives the light emitting device 10 based on the image signal, sequentially rewrites the lighting maintenance period Uc as a frame, so that a video of the two-dimensional image is obtained. These two-dimensional still images and video are projected on the screen 60.

In the above description, it is assumed that the laser diode LD is switched from non-lighting into lighting (emitting), but a light emitting intensity in the light emitting state may be increased.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light emitting device comprising:
    a plurality of transfer elements to be sequentially turned on;
    a plurality of setting elements that are respectively connected to the plurality of transfer elements and are capable of shifting to an on-state by the transfer element being turned on;
    a plurality of driving elements that are respectively connected to the plurality of setting elements and are capable of shifting to the on-state by the setting element being turned on; and
    a plurality of light emitting elements that are respectively connected to the plurality of driving elements and have increased light-emission or an increased light-emission intensity by the driving element being turned on,
    wherein a plurality of pairs of the driving element and the light emitting element are connected to at least one of the plurality of setting elements and the plurality of light emitting elements are arranged in a two-dimensional shape.

2. The light emitting device according to claim 1,
wherein the plurality of pairs of the driving element and the light emitting element are connected to each of the plurality of setting elements.

3. The light emitting device according to claim 2, further comprising:
a plurality of lighting signal lines that supply a current for increasing light-emission or a light-emission intensity to the light emitting element via the driving element,
wherein the lighting signal line is provided to connect the driving elements to each other, the driving element being connected the setting elements different from each other.

4. The light emitting device according to claim 1,
wherein the driving element and the light emitting element are connected in series and are provided so that a current for increasing light-emission or a light-emission intensity flows to the light emitting element via the driving element.

5. The light emitting device according to claim 4,
wherein the driving element and the light emitting element are provided so that the light emitting element is connected to a side to which a reference potential is supplied.

6. The light emitting device according to claim 1, further comprising:
a control unit that controls the plurality of light emitting elements so that the plurality of light emitting elements arranged in a two-dimensional shape are maintained in the on-state in parallel.

7. The light emitting device according to claim 6,
wherein among the plurality of light emitting elements arranged in a two-dimensional shape, the control unit controls light emitting elements of lighting targets to be sequentially lighted and, after the sequential lighting, controls the plurality of light emitting elements sequentially lighted to be maintained in the on-state in parallel.

8. The light emitting device according to claim 6,
wherein the control unit controls light emitting elements of lighting targets to be sequentially lighted, among some light emitting elements of the plurality of light emitting elements arranged in a two-dimensional shape during a first period,
controls light emitting elements of lighting targets to be sequentially lighted, among other light emitting elements of the plurality of light emitting elements arranged in a two-dimensional shape during a second period following the first period, and
controls a plurality of the light emitting elements lighted during the first period and the second period to be maintained in the on-state in parallel, during a third period following the second period.

9. The light emitting device according to claim 8,
wherein the control unit controls the third period to be longer than the first period.

10. An optical measurement apparatus comprising:
the light emitting device according to claim 1;
a light receiving unit that receives light reflected from a target object irradiated with the light from the light emitting device; and
a processing unit that processes information on the light received by the light receiving unit to measure a distance from the light emitting device to the target object or a shape of the target object.

11. An image forming apparatus comprising:
the light emitting device according to claim 1;
a driving control unit that drives the light emitting device based on an image signal so that an input of the image signal is received and a two-dimensional image is formed by light emitted from the light emitting device.

* * * * *